(12) United States Patent
Gerber et al.

(10) Patent No.: US 9,202,544 B2
(45) Date of Patent: Dec. 1, 2015

(54) MULTI-BIT MAGNETIC MEMORY CELL

(75) Inventors: Alexander Gerber, Tel Aviv (IL); Amir Segal, Modiin (IL)

(73) Assignee: RAMOT AT TEL AVIV UNIVERSITY LTD., Tel Aviv (IL)

(*) Notice: Subject to any disclaimer, the term of this patent is extended or adjusted under 35 U.S.C. 154(b) by 0 days.

(21) Appl. No.: 14/235,133

(22) PCT Filed: Jul. 19, 2012

(86) PCT No.: PCT/IB2012/053674
§ 371 (c)(1),
(2), (4) Date: Jan. 27, 2014

(87) PCT Pub. No.: WO2013/017981
PCT Pub. Date: Feb. 7, 2013

(65) Prior Publication Data
US 2014/0177328 A1 Jun. 26, 2014

Related U.S. Application Data

(60) Provisional application No. 61/514,064, filed on Aug. 2, 2011.

(51) Int. Cl.
*G11C 11/16* (2006.01)
*G11C 11/18* (2006.01)
*G01R 15/20* (2006.01)

(52) U.S. Cl.
CPC ............ *G11C 11/161* (2013.01); *G01R 15/202* (2013.01); *G11C 11/16* (2013.01); *G11C 11/1673* (2013.01); *G11C 11/1675* (2013.01); *G11C 11/18* (2013.01)

(58) Field of Classification Search
CPC .................................. G11B 5/33; G11C 11/161
USPC .................................. 365/153, 148; 360/324.2
See application file for complete search history.

(56) References Cited

U.S. PATENT DOCUMENTS

| | | | |
|---|---|---|---|
| 5,361,226 A | 11/1994 | Taguchi et al. | |
| 5,652,445 A * | 7/1997 | Johnson | 257/295 |
| 6,727,537 B2 | 4/2004 | Wunderlich | |
| 7,379,321 B2 | 5/2008 | Ravelosona et al. | |
| 7,463,447 B2 | 12/2008 | Gerber | |
| 7,709,754 B2 | 5/2010 | Doogue et al. | |
| 2003/0235072 A1 | 12/2003 | Kim et al. | |
| 2006/0176620 A1* | 8/2006 | Ravelosona et al. | 360/324.2 |
| 2008/0151615 A1 | 6/2008 | Rodmacq et al. | |

(Continued)

OTHER PUBLICATIONS

International Application # PCT/IB2012/053674 Search Report dated Oct. 31, 2012.

(Continued)

*Primary Examiner* — Son Mai
*Assistant Examiner* — Muna A Techane
(74) *Attorney, Agent, or Firm* — D. Kligler I.P. Services Ltd.

(57) ABSTRACT

A device (20) for storing data includes at least first and second ferromagnetic films (F1, F2) and a sensing circuit (28). The ferromagnetic films both have perpendicular magnetic anisotropy that is configured responsively to the stored data, and are connected so that an electrical current traverses the first and second ferromagnetic films and generates respective first and second extraordinary Hall voltages therein. The sensing circuit is configured to read out the stored data by measuring the first and second extraordinary Hall voltages.

27 Claims, 15 Drawing Sheets

(56) References Cited

U.S. PATENT DOCUMENTS

2008/0205129 A1     8/2008    Stephenson et al.
2010/0110785 A1     5/2010    Chen et al.
2012/0236528 A1*   9/2012    Le et al. .................... 361/818

OTHER PUBLICATIONS

Uemura et al., "Four-State Magnetoresistance in Epitaxial CoFe-Based Magnetic Tunnel Junctions", IEEE Transactions on Magnetics, vol. 43, No. 6, pp. 2791-2793, Jun. 2007.

Law et al., "Magnetoresistance and Switching Properties of Co—Fe/Pd-Based Perpendicular Anisotropy Single- and Dual-Spin Valves", IEEE Transactions on Magnetics, vol. 44, No. 11, pp. 2612-2615, Nov. 2008.

Yoo et al.,"Four discrete hall resistance states in single-layer Fe film for quaternary memory devices", Applied Physics Letters, vol. 95, 4 pages, year 2009.

Casimir, H.B.G., "On onsager's principle of microscopic reversibility", Review of Modern Physics, vol. 17, Nos. 2-3, pp. 343-350, Apr.-Jul. 1945.

Spal, R., "A new dc method of measuring the magnetoconductivity tensor of anisotropic crystals", Journal of Applied P, vol. 41, No. 8, Aug. 1980.

Sample et al., "Reverse-field reciprocity for conducting specimens in magnetic fields", Journal of Applied Physics, vol. 61, No. 3, pp. 1079-1084, Feb. 1, 1987.

Cornils et al., "Reverse-magnetic-field reciprocity in conductive samples with extended contacts", Journal of Applied Physics 104, 8 pages, year 2008.

European Application # 12819702.7 Search Report dated Feb. 24, 2015.

Riss O et al., "Offset reduction in hall effect measurements using a nonswitching van der pauw technique", Review of scientific instruments, vol. 79, No. 7, pp. 73901-1-73901-3, Jul. 1, 2008.

Segal et al.,"Sixteen-state magnetic memory based on the extraordinary hall effect", Journal of magnetism and magnetic materials, vol. 324, No. 8, pp. 1557-1560, Dec. 9, 2011.

* cited by examiner

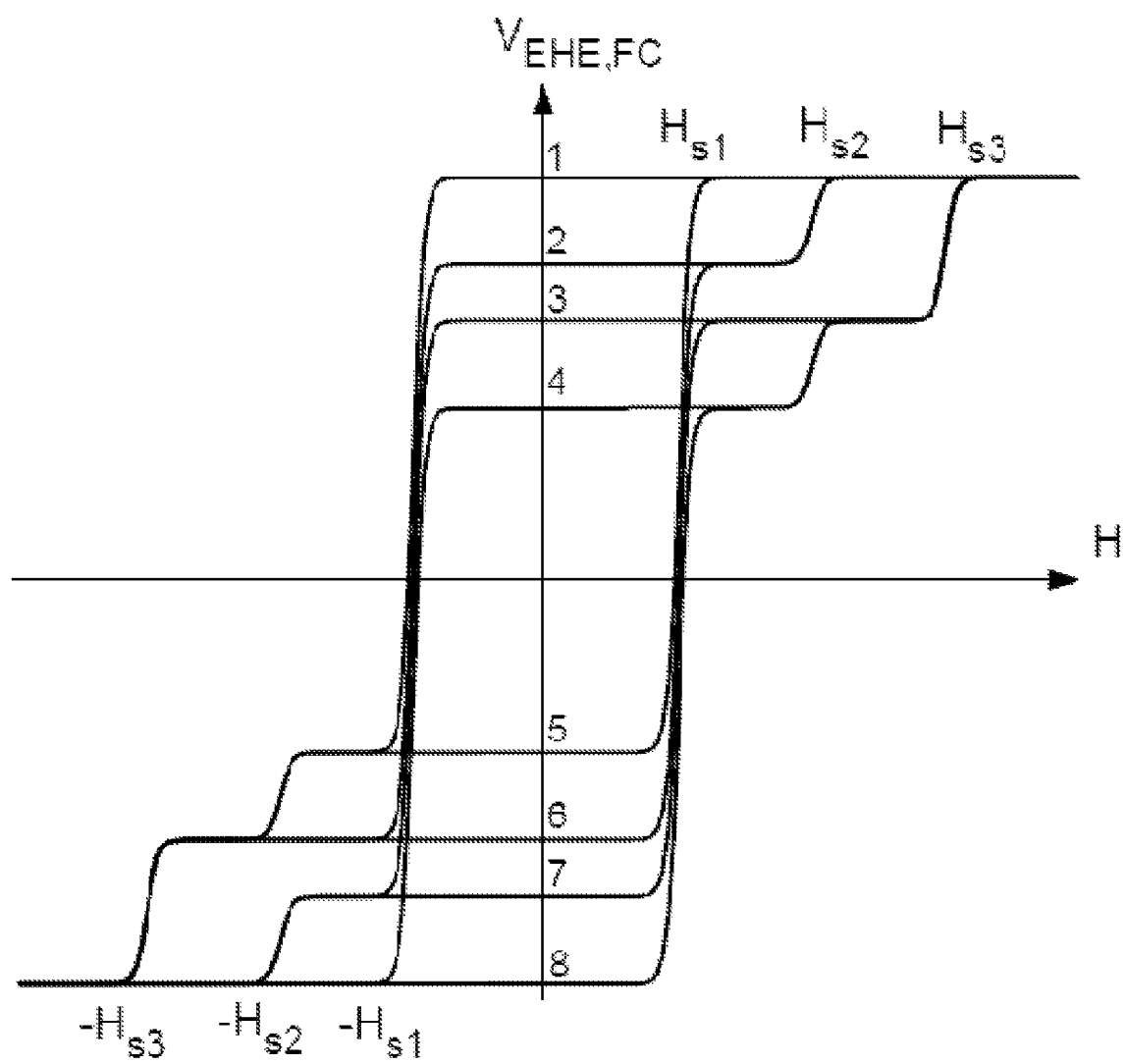

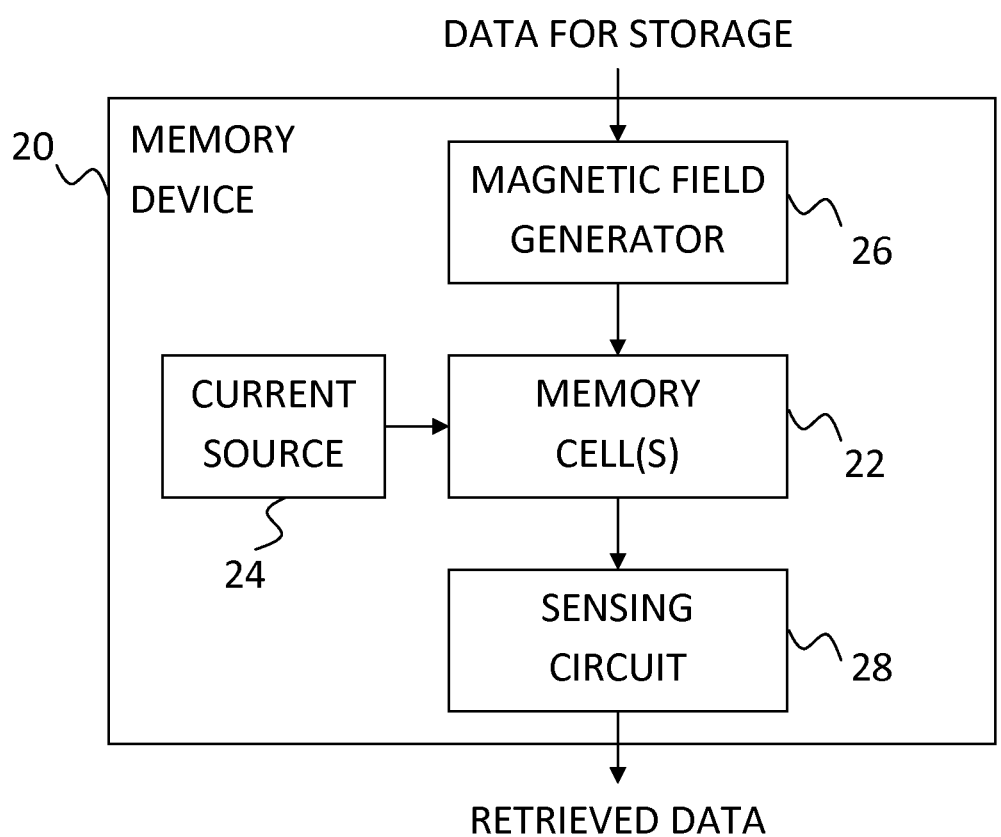

MULTI-BIT MAGNETIC MEMORY CELL

CROSS-REFERENCE TO RELATED APPLICATIONS

This application claims the benefit of U.S. Provisional Patent Application 61/514,064, filed Aug. 2, 2011, whose disclosure is incorporated herein by reference.

FIELD OF THE INVENTION

The present invention relates generally to magnetic memory devices, and particularly to memory devices where data stored in magnetic media is read using the extraordinary Hall effect.

BACKGROUND OF THE INVENTION

Non-volatile magnetic random access memories (MRAMs) have been proposed as candidates to replace conventional dynamic random access memories (DRAMs) and hard disk drives. Such memory devices make use of the giant magnetoresistance (GMR) and tunneling magnetoresistance (TMR) sensing techniques. Currently implemented MRAM devices utilize two magnetic layers magnetized in-plane or out-of-plane so that variations in the GMR and/or TMR may be measured. The magnetic layers have magnetic orientations which are either parallel or anti-parallel to each other, which create four possible magnetic states and give rise to two different GMR or TMR resistances associated with bits "0" and "1".

A different memory cell structure makes use of the extraordinary Hall effect in ferromagnetic materials. A memory cell has a ferromagnetic layer possessing perpendicular magnetic anisotropy with magnetic moment oriented perpendicular to the plane of the ferromagnetic layer. The extraordinary Hall resistance is exhibited between first and second ends of the ferromagnetic layer across a path which intersects a bias current path between third and fourth ends of the ferromagnetic structure. Such a magnetic layer has two stable magnetic orientations: up and down, and gives rise to two different extraordinary Hall values +RH and −RH associated with bits "0" and "1". A magnetic memory unit of this type with enhanced values of RH has been disclosed in U.S. Pat. No. 7,463,447 B2 (2008) to A. Gerber, whose disclosure is incorporated herein by reference.

Another memory cell structure makes use of the normal, or ordinary, Hall effect in low carrier density materials such as semiconductors. A memory cell has a low carrier density material film in the shape of a cross which constitutes a Hall sensor, on top of which a spacer is placed to prevent electric current leakage, and on top of that a ferromagnetic dot, or ferromagnetic dots are deposited. Such magnetic dots have two stable magnetic orientations up and down. Ferromagnetic dots are placed at locations that induce strong magnetic stray flux through the sensor. The normal Hall resistance in the low carrier density film is sensitive to cumulative stray flux from the magnetized ferromagnetic dots, and gives rise to two different normal Hall values +RH and −RH associated with bits "0" and "1". A magnetic memory unit of this type has been disclosed in U.S. Patent Application Publication 2008/0205129 to J. Stephenson, B. Shipley, and D. Carothers, whose disclosure is incorporated herein by reference.

In an effort to further increase the ultimate storage density of MRAMs, several multi-state structures and storage schemes have been proposed using both in-plane and perpendicular anisotropy materials. Angular dependent four-state tunneling magnetoresistance cells were proposed by Uemura et al., in "Four-State Magnetoresistance in Epitaxial CoFe-Based Magnetic Tunnel Junctions," IEEE Transactions on Magnetics, volume 43, pages 2791-2793 (2007), which is incorporated herein by reference.

Four-state dual spin valve GMR storage was proposed by Law et al., in "Magnetoresistance and Switching Properties of Co—Fe/Pd-Based Perpendicular Anisotropy Single- and Dual-Spin Valves," IEEE Transactions on Magnetics, volume 44, pages 2612-2615 (2008), which is incorporated herein by reference. A four-state single-layer Fe film device was proposed by Yoo et al., in "Four Discrete Hall Resistance States in Single-Layer Fe Film for Quaternary Memory Devices," Applied Physics Letters, volume 95, 202505 (2009), which is incorporated herein by reference.

A memory cell having two separated ferromagnetic layers was disclosed in U.S. Pat. No. 7,379,321 to D. Ravelosona and B. D. Terris, whose disclosure is incorporated herein by reference. U.S. Pat. No. 5,361,226, to Taguchi, et al., whose disclosure is incorporated herein by reference, describes a magnetic thin film memory device having information recorded in a magnetic thin film by the direction of magnetization. The disclosure states that the film is adapted to reproduce the recorded information on the basis of the voltage generated as a result of the change of the magnetization direction due to the extraordinary Hall effect.

U.S. Pat. No. 6,727,537, to Wunderlich, whose disclosure is incorporated herein by reference, describes a magnetic memory device based on easy domain wall propagation and the extraordinary Hall effect, and which is stated to include a "perpendicular-to-plane" magnetic electrically conductive element.

SUMMARY OF THE INVENTION

An embodiment of the present invention that is described herein provides a device for storing data. The device includes at least first and second ferromagnetic films and a sensing circuit. The ferromagnetic films both have perpendicular magnetic anisotropy that is configured responsively to the stored data, and are connected so that an electrical current traverses the first and second ferromagnetic films and generates respective first and second extraordinary Hall voltages therein. The sensing circuit is configured to read out the stored data by measuring the first and second extraordinary Hall voltages.

In some embodiments, each of the first and second ferromagnetic films includes at least one ferromagnetic layer. In an embodiment, each ferromagnetic layer defines one of two memory states. In an example embodiment, the first film includes n1 layers, the second film includes n2 layers, wherein n1, n2 are integers greater than 0, and the number of memory states is $2^{n1+n2}$.

In some embodiments, the device includes a current source that is configured to generate the electrical current and provide the electrical current to the ferromagnetic films. In an embodiment, the device includes a conductor that connects the ferromagnetic films in series to one another, and the current source is configured to apply the electrical current so as to traverse the ferromagnetic films and the conductor. In an alternative embodiment, the device includes a conductor that connects the ferromagnetic films in parallel to one another, the current source is configured to generate and apply a first electrical current to the first ferromagnetic film and a second electrical current to the second ferromagnetic film, and the sensing circuit is configured to measure a sum of the first and second extraordinary Hall voltages.

In another embodiment, the sensing circuit is configured to apply a reverse magnetic field reciprocity (RMFR) theorem to the films so as to measure the first and second extraordinary Hall voltages. In a disclosed embodiment, the device includes a magnetic field generator that is configured to store the data in the ferromagnetic films by applying a magnetic field that writes into the ferromagnetic films respective magnetic states that represent the data.

In a disclosed embodiment, the magnetic field generator is configured to accept the data for storage, to produce, responsively to the data, a sequence of one or more magnetic field pulses that write the magnetic states, and to apply the sequence to the ferromagnetic films. In an embodiment, the magnetic field generator is configured to produce the sequence responsively to the data and to respective switching magnetic fields of the ferromagnetic films. In an embodiment, the magnetic field generator is configured to produce the magnetic field pulses so as to alternate in polarity and decrease in magnitude along the sequence.

In some embodiments, the first and second ferromagnetic films lie in a common two-dimensional plane. In alternative embodiments, the first and second ferromagnetic films are stacked on top of one another to form a three-dimensional structure. In an embodiment, the first and second ferromagnetic films are characterized by respective, different switching magnetic fields.

There is additionally provided, in accordance with an embodiment of the present invention, a method for data storage. The method includes providing at least first and second ferromagnetic films, which are connected to one another and both have perpendicular magnetic anisotropy. Data is stored in the first and second ferromagnetic films by configuring the perpendicular magnetic anisotropy of the films responsively to the data, so that an electrical current traverses the first and second ferromagnetic films and generates respective first and second extraordinary Hall voltages therein. The stored data is read out by measuring the first and second extraordinary Hall voltages.

There is also provided, in accordance with an embodiment of the present invention, apparatus including first and second hall sensors, a conductor and a processor. The first Hall sensor has a first terminal, a second terminal, a third terminal and a fourth terminal. The second Hall sensor has a fifth terminal, a sixth terminal, a seventh terminal and an eighth terminal. The conductor connects the third terminal to the fifth terminal. The processor is configured to measure a first potential between the fourth terminal and the sixth terminal while transferring a first current from the first terminal to the seventh terminal via the conductor, to measure a second potential between the first terminal and the seventh terminal while transferring a second current from the fourth terminal to the sixth terminal via the conductor, and to determine a resultant voltage generated by the first and second Hall sensors in response to the first and second potentials.

In some embodiments, at least one of the first and second Hall sensors generates normal Hall voltages. In some embodiments, least one of the first and second Hall sensors generates extraordinary Hall voltages.

There is further provided, in accordance with an embodiment of the present invention, a method including providing a first Hall sensor having a first terminal, a second terminal, a third terminal and a fourth terminal, and a second Hall sensor having a fifth terminal, a sixth terminal, a seventh terminal and an eighth terminal. The third terminal is connected to the fifth terminal by a conductor. While transferring a first current from the first terminal to the seventh terminal via the conductor, a first potential is measured between the fourth terminal and the sixth terminal. While transferring a second current from the fourth terminal to the sixth terminal via the conductor, a second potential is measured between the first terminal and the seventh terminal. A resultant voltage generated by the first and second Hall sensors is determined in response to the first and second potentials.

There is additionally provided, in accordance with an embodiment of the present invention, a memory cell for storing data. The memory device includes at least first and second ferromagnetic films, which both have perpendicular magnetic anisotropy that is configured responsively to the stored data, and which are connected so that an electrical current traverses the first and second ferromagnetic films and generates respective first and second extraordinary Hall voltages therein, so as to enable readout of the data from the memory cells by measuring the first and second extraordinary Hall voltages.

The present invention will be more fully understood from the following detailed description of the embodiments thereof, taken together with the drawings in which:

BRIEF DESCRIPTION OF THE DRAWINGS

FIG. 6c is a schematic presentation of EHE voltage VEHE, FC measured between points F (film 1) and C (film 2) at different minor loops and at a major loop after removal of the longitudinal voltage V1, according to an embodiment of the present invention.

FIG. 14 is a block diagram that schematically illustrates a memory device, according to an embodiment of the present invention.

DETAILED DESCRIPTION OF EMBODIMENTS

Figure 1:
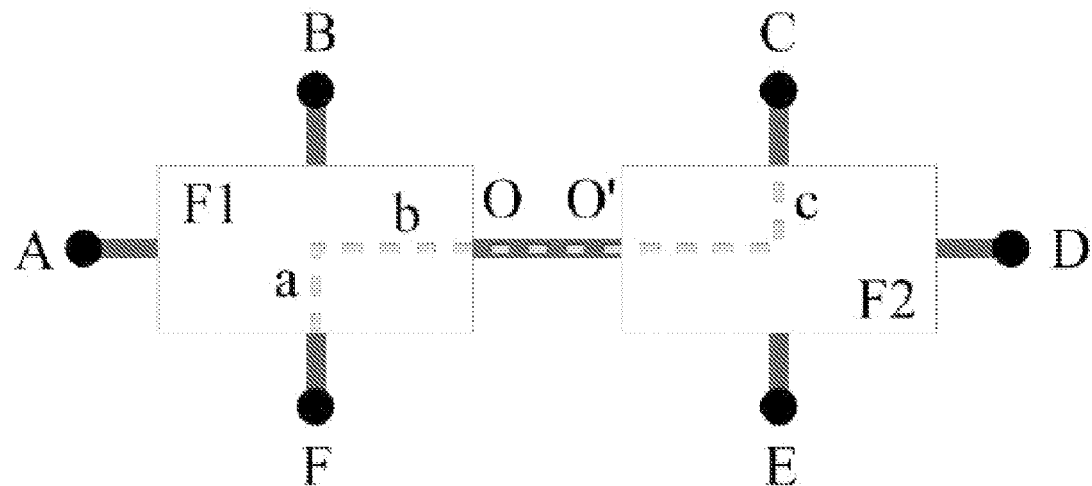
FIG. 1 is a schematic presentation of a memory cell including two ferromagnetic elements F1 and F2, a conducting connection between two elements O-O' carrying the bias current and electric contacts to two films: A, B, F to film F1 and electric contacts C, D, E to film F2, according to an embodiment of the present invention.

A memory cell according to an embodiment of the present invention comprises two ferromagnetic films, typically in the form of layers, exhibiting perpendicular magnetic anisotropy. In the absence of an external magnetic field, the magnetic moments of both films are oriented perpendicular to the plane of the layer and can exhibit either a single magnetization value or a plurality of magnetization values corresponding to the relative magnetization orientations of intra-film layers.

Each film may be characterized by either a single value of the switching field or by a plurality of switching fields corresponding to a plurality of magnetization sets. Consequently, reversal of magnetic moment from a given to an opposite direction takes place by either a single step or by a plurality of well defined steps. Each ferromagnetic film may exhibit either a single absolute value of the extraordinary Hall resistance or a plurality of the extraordinary Hall resistances corresponding to the set of magnetization states of a given film. (The extraordinary Hall effect is also sometimes referred to as the anomalous Hall effect.)

In a disclosed embodiment a bias current circuit is adapted to produce a bias current having a bias path between the first and the second film of the cell, so that the same bias current flows in the first and second films. A voltage sensing circuit is adapted to measure a voltage level between the two films of the cell, the level varying in accordance with each one of a plurality of predetermined extraordinary Hall resistances corresponding to a plurality of magnetic states of the two-film system.

The number of discrete memory states N demonstrated by a pair of films depends on the number of stable magnetic states exhibited by the films. For two films exhibiting single step magnetization reversal and different values of switching fields and extraordinary Hall resistances the number of memory states is 4. For two films exhibiting two-step magnetization reversals and different values of respective switching fields and extraordinary Hall resistances the number of memory states is 16. For two films exhibiting three-step magnetization reversals and different values of respective switching fields and extraordinary Hall resistances the number of memory states is 64. In general, for a system composed of two films the number of possible memory states is $2^{(n_1+n_2)}$, where $n_1$ and $n_2$ are the number of distinct sections or layers exhibiting different switching fields and extraordinary Hall resistances in the first and the second films respectively.

For improved resolution of the memory reading process a signal detection protocol employs two four probe measurements. For two pads A and B attached to the first film of the cell and pads C and D attached to the second film of the cell, two voltage measurements are taken: $V_{AD,BC}$ and $V_{BC,AD}$ where $V_{AD,BC}$ indicates the value of voltage developed between contacts B of the first film and C of the second film with bias current being passed between contact A of the first film and contact D of the second film. $V_{BC,AD}$ indicates the value of voltage developed between contacts A of the first film and D of the second film when bias current is passed between contact B of the first film and contact C of the second film. By addition or subtraction of $V_{AD,BC}$ and $V_{BC,AD}$ an odd in-field extraordinary Hall effect component is extracted from the total measured inter-film voltage.

Memory cells in accordance with embodiments of the present invention make use of the extraordinary Hall effect for increased data storage capacity. FIG. 1 presents a schematic view of a memory cell, according to an embodiment of the present invention. A typical memory cell comprises two ferromagnetic films F1 and F2, each in the form of a plane layer, and each of the films exhibiting perpendicular magnetic anisotropy. In the absence of an external magnetic field magnetic moments of both films are oriented perpendicular to the plane of the layer. The magnetic moments may have either a single magnetization value or a plurality of magnetization values corresponding to relative magnetization orientations of intra-film sections, the sections comprising multiple different ferromagnetic layers. Each film is characterized by either a single value of the switching field or by a plurality of switching fields, therefore reversal of magnetic moment from a given to an opposite direction takes place by either a single step or by a plurality of well defined steps. Each ferromagnetic film exhibits either a single absolute value of the extraordinary Hall resistance or a plurality of the extraordinary Hall resistances corresponding to the set of magnetization states of that film.

In the memory cell, films F1 and F2 are connected in series, and a bias current source (not shown in the figure) produces a bias current from A to D, including a bias path OO' between the first and the second film of the cell, so that there is a common current in films F1 and F2. A voltage sensing circuit (also not shown) is adapted to measure a voltage level between two films of the cell. As described below the voltage level may be used to determine a plurality of predetermined extraordinary Hall resistances corresponding to a plurality of magnetic states of the two-film system.

Each of the two films comprising the memory cell has a ferromagnetic structure which includes at least one layer, or a plurality of layers, exhibiting perpendicular magnetic anisotropy. The ferromagnetic layers have magnetic moments, lying perpendicular to the planes of the layers, which are set in accordance with one orientation or a plurality of magnetic orientation sets of the ferromagnetic structure. The ferromagnetic structure exhibits one of a plurality of predetermined extraordinary Hall resistances in accordance with the magnetic orientation set.

In the present disclosure, a ferromagnetic layer is defined by its switching field, i.e., the magnetic field required to switch the magnetic orientation of the layer, and by the extraordinary Hall effect (EHE) resistance of the layer. As is explained further below in relation to the examples of FIGS. 9-11, a given ferromagnetic layer may comprise a number of strata, including ferromagnetic and non-ferromagnetic strata, which together have one or more switching fields and one or more EHE resistances. Furthermore, as is also exemplified in the cases of FIGS. 9-11, the switching fields and the EHE resistances may be set according to the physical dimensions of the ferromagnetic and non-ferromagnetic strata, the proximity of the strata to a substrate or seed layer, and the dimensions and type of the substrate or seed layer.

The extraordinary Hall resistance is exhibited between first and second ends of the ferromagnetic structure (points B and F in film F1 and points C and E in film F2) across a path that intersects a bias current path between third and fourth ends of the ferromagnetic films (points A and O in film F1 and points O' and D in film F2).

In uniform ferromagnetic films the Hall effect voltage VH can be expressed as $$V_H = \frac{I}{t}(R_0 B + \mu_0 R_{EHE} M) \quad [1]$$

where I is electrical current, t the sample thickness, R0 and REHE are the ordinary and extraordinary Hall effect (EHE) coefficients, and B and M are magnetic field induction and magnetization components normal to the film respectively.

The extraordinary Hall effect, represented by coefficient REHE in ferromagnetic structures, is generally attributed to scattering of electrons in the presence of spin-orbit interactions. In most ferromagnets the EHE component dominates over the ordinary Hall component, and VH is proportional to the film magnetization (the ordinary Hall component will be neglected in the rest of the description unless stated otherwise). Given a ferromagnetic film with a perpendicular magnetic anisotropy exhibiting hysteresis in its magnetization response to applied magnetic field, the remanent out-of-plane magnetization (magnetization exhibited by the material after reducing the applied field to zero) can be detected by measuring a transverse voltage generated due to the EHE, thus reading the magnetic state of the film.

Figure 2:
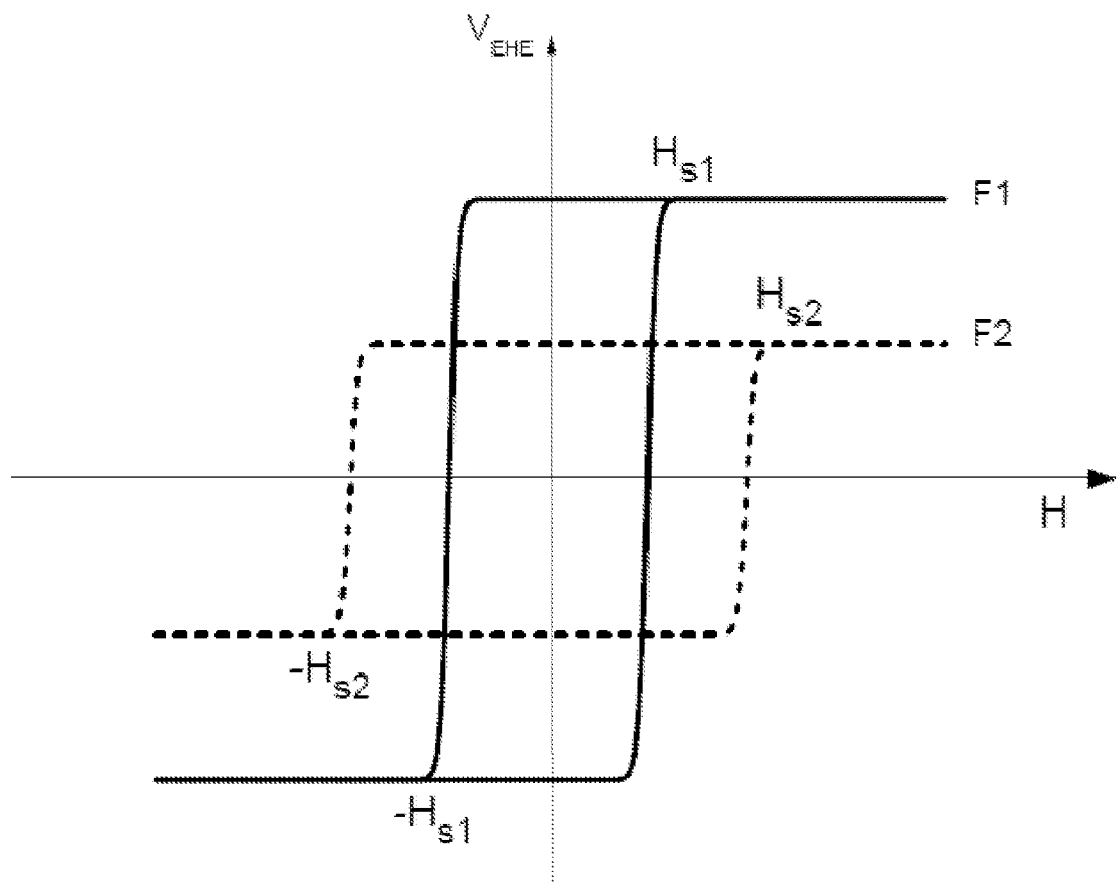
FIG. 2 is a schematic presentation of the extraordinary Hall effect voltage developed by two uniform cells F1 and F2 as a function of applied field H, according to an embodiment of the present invention. Both cells exhibit perpendicular magnetic anisotropy with a single step reversal at switching fields Hs1 and Hs2 respectively. The extraordinary Hall effect voltages exhibited by the films in magnetically saturated state are VEHE1 and VEHE2 respectively.

FIG. 2 is a schematic presentation of the extraordinary Hall voltage developed in film F1 between points B and F and in film F2 between points C and E measured as a function of magnetic field applied perpendicular to the planes of the films with bias current applied between points A and D, according to an embodiment of the present invention.

Each film has a uniform structure and exhibits a correlated, uniform, single step magnetization reversal between the up- and down-magnetized states. The hysteresis loop of film F1 is characterized by coercive (switching) field Hs1 and the magnitude of the Hall voltage in the saturated state VH1 in a positive field and (−VH1) in a negative field. Hysteresis loop of film F2 is characterized by coercive (switching) field Hs2 and the magnitude of the Hall voltage in the saturated state VH2. After saturating magnetization in high positive or negative fields and reducing the applied field to zero, the film F1 exhibits remanent Hall voltage +VH1 or −VH1, while film F2 exhibits remanent Hall voltage +VH2 or −VH2.

A magnetic state of the memory cell is determined according to the voltage developed between two films of the cell. The magnetic state of the device is read by measuring voltage VAD,FC which is defined as the voltage between points F and C with bias current passing between contacts A and D.

VAD,FC has two contributions: the voltage across the longitudinal resistance of the electrical connection between films F1 and F2, denoted as VL, and a second contribution comprising half the sum of the Hall voltages VAD,FB and VAD,EC developed in films F1 and F2 respectively (VAD,FB is the Hall voltage VH1 exhibited between contacts FB with bias current flowing between contacts A and D; VAD,EC is the Hall voltage VH2 exhibited between contacts EC with bias current flowing between contacts A and D:

$$V_{AD,FC} = V_L + \frac{V_{AD,FB} + V_{AD,EC}}{2} \quad [2]$$
$$= V_L + \frac{V_{H1} + V_{H2}}{2}$$
$$= V_L + \frac{\mu_0 I}{2}\left[\frac{R_{EHE1} M_1}{t_1} + \frac{R_{EHE2} M_2}{t_2}\right]$$

Eq. 2 is obtained by integration of the electric field along the path from point F to C, as shown schematically in FIG. 1. Segments a and c are orthogonal to the current flow, and contribute the Hall voltages, and segment b is parallel to the current and contributes the longitudinal resistance related voltage VL. Thus, the voltage drop developed between two films of the magnetic memory cell depends on the extraordinary Hall resistance developed in each of the films.

Alternatively, the magnetic state of the device is read by measuring voltage VAD,FE which is defined as the voltage between points F and E with bias current passing between contacts A and D. In this case VAD,FE is given by:

$$V_{AD,FE} = V_L + \frac{V_{AD,FB} - V_{AD,EC}}{2} \quad [3]$$
$$= V_L + \frac{V_{H1} - V_{H2}}{2}$$
$$= V_L + \frac{\mu_0 I}{2}\left[\frac{R_{EHE1} M_1}{t_1} - \frac{R_{EHE2} M_2}{t_2}\right]$$

Figure 3:
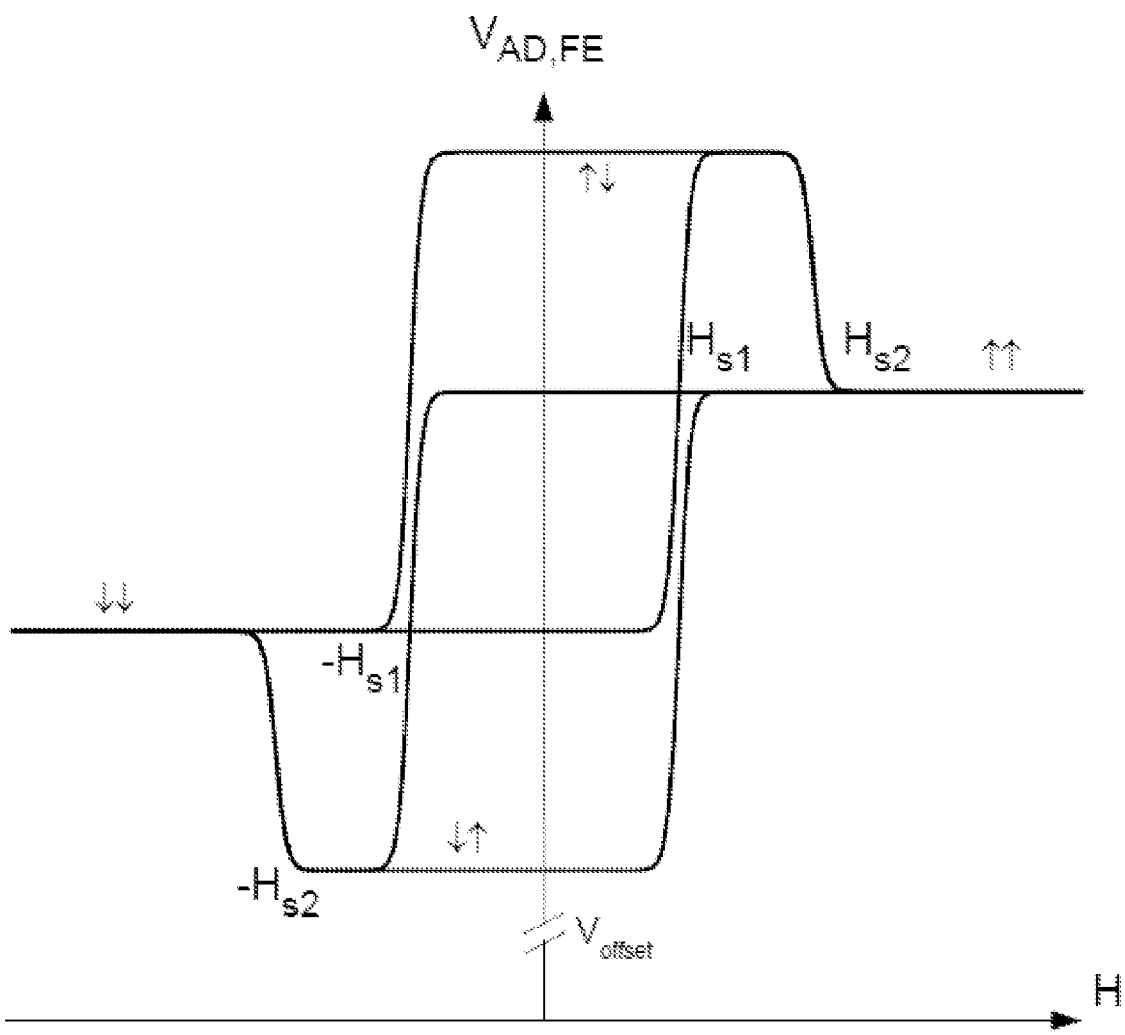
FIG. 3 is a schematic presentation of voltage developed between points F (on film F1) and point E (on film F2) with electric current flowing between point A (on film F1) and point D (on film F2) as a function of applied magnetic field, according to an embodiment of the present invention. Four different voltages can be exhibited by the cell after returning to zero field, depending on magnetization orientation in both cells. Each voltage level corresponds to a different memory state.

FIG. 3 is a schematic presentation of voltage developed between point F (on film F1) and point E (on film F2) with electric current flowing between point A (on film F1) and point D (on film F2) as a function of applied magnetic field, according to an embodiment of the present invention. Four different voltages can be exhibited by the cell after returning to zero field, depending on the magnetization orientation in both cells. Each voltage level corresponds to a different memory state.

Voltages $V_{AD,FC}$ in Eq. 2 and $V_{AD,FE}$ in Eq. 3 contain the combined EHE term and the longitudinal resistance term $V_L$.

In regular ferromagnetic materials like Co, Fe, Ni and their alloys the extraordinary Hall resistivity is about two orders of magnitude smaller than the longitudinal resistivity. Therefore, the longitudinal voltage $V_L$ may be much larger than the variable EHE term, resulting in a small relative change of the output signal when switching from one memory state to another.

In some embodiments of the present invention, suppression of the background longitudinal voltage may be achieved by application of a reverse magnetic field reciprocity (RMFR) theorem, which is well known in the art. According to the RMFR theorem:

$$V_{ab,cd}(H) = V_{cd,ab}(-H) \quad [4]$$

Where a, b, c, and d are four arbitrary locations in a system. In ferromagnetic materials magnetization replaces the applied magnetic field, giving in our case:

$$V_{AD,FC}(M) = V_{FC,AD}(-M) \quad [5]$$

The longitudinal resistance voltage $V_L$ is an even function of the magnetization: $V_1(M) = V_1(-M)$, i.e. its value does not change when the magnetization reverses under application of a magnetic field with reversed polarity. The EHE voltage is an odd function of magnetization, i.e.:

$$V_{AD,FB}(M) = -V_{AD,FB}(-M) \quad [6]$$

By performing two measurements $V_{AD,FC}(H)$ and $V_{FC,AD}(H)$ at the same applied magnetic field or in the same magnetization state and by subtracting one signal from another one gets a sum of Hall effect voltages exhibited by both films free from the background component $V_L$:

$$V_{AD,FC}(M) - V_{FC,AD}(M) = V_{AD,FC}(\vec{M}) - V_{AD,FC}(-\vec{M}) = V_{AD,FB}(\vec{M}) + V_{AD,EC}(\vec{M}) = V_{EHE1} + V_{EHE2} \quad [7]$$

For measurements performed using contacts A, D, F, E the result of subtraction will be:

$$V_{AD,FE}(M) - V_{FE,AD}(M) = V_{EHE1} - V_{EHE2} \quad [8]$$

Figure 4A:
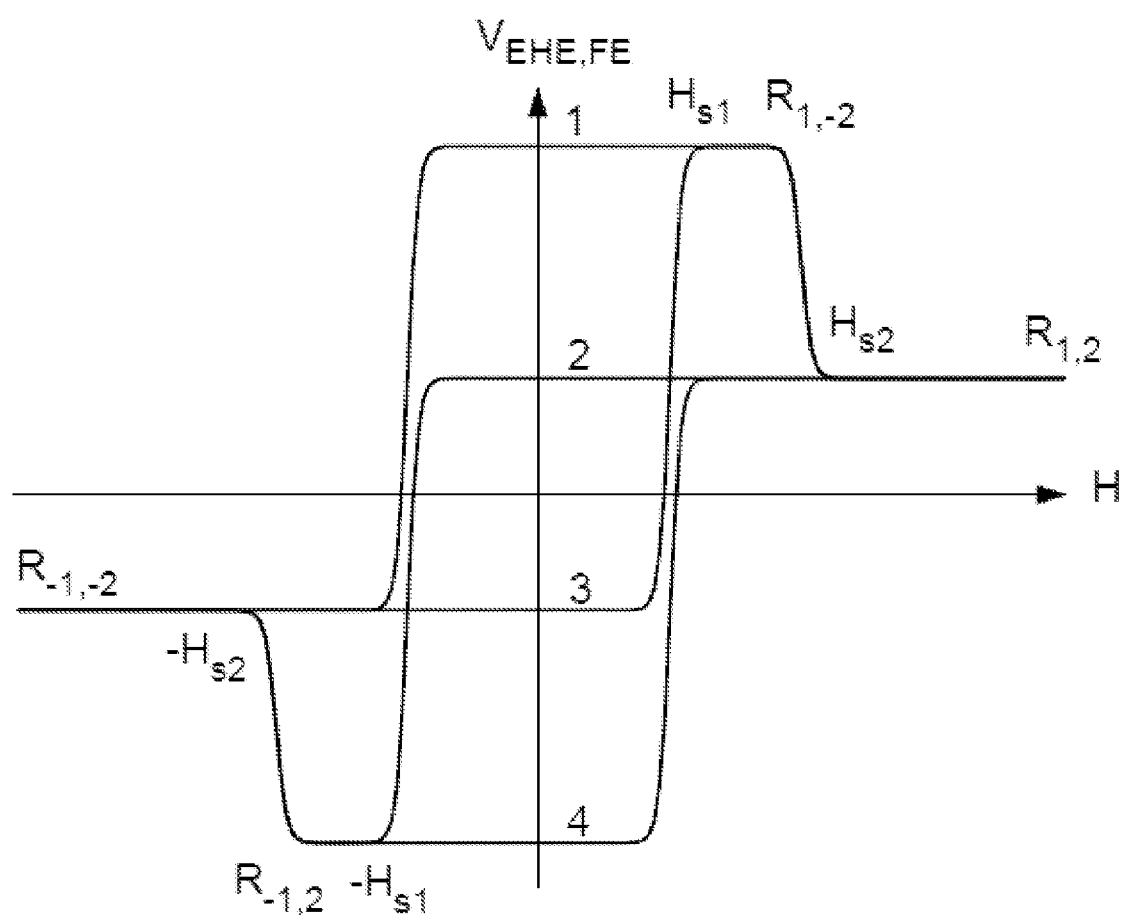
FIG. 4a is a schematic presentation of the extraordinary Hall effect signal developed between point F (on film F1) and point E (on film F2) after subtraction of an offset voltage, according to an embodiment of the present invention. The offset voltage is cancelled by subtracting the results of two measurements: VAD,FE and VFE,AD where VAD,FE indicates the voltage measured between points F and E with current passing between A and D, and VFE,AD is the voltage measured between points A and D with current passing between F and E.
Figure 4B:
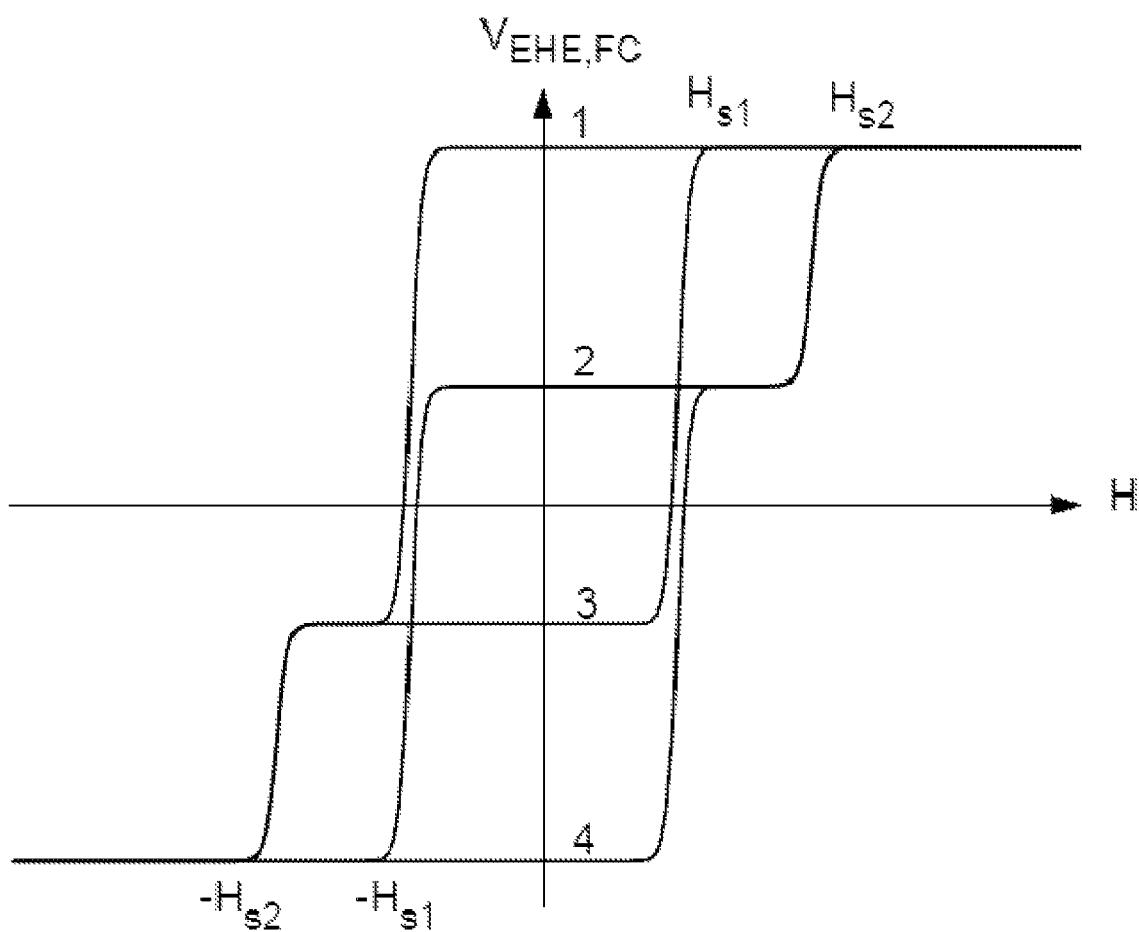
FIG. 4b is a schematic presentation of the extraordinary Hall effect voltage developed between point F (on film F1) and point C (on film F2) after subtraction of the offset voltage, according to an embodiment of the present invention.

The EHE components obtained after reduction of the longitudinal voltage between points FE $V_{EHE,FE}$ and FC $V_{EHE,FC}$ are shown schematically in FIGS. 4a and 4b.

Eqs. 2, 3 were developed for two films, each possessing a single value Hall resistance in the saturated state and a single well defined switching field. It is known in the art that one can fabricate magnetic units demonstrating hysteresis loops containing a plurality of intermediate magnetization levels exhibiting switching at different corresponding switching fields. A film containing a plurality of parallel layers exhibiting a plurality of respective switching fields and a plurality of the respective EHE resistances will generate a total EHE voltage of:

$$V_{EHE} = \frac{\mu_0}{2} \sum_i \frac{I_i R_{EHE,i} M_i}{t_i} \quad [9]$$

where $I_i$ is electric current flowing along the layer i, $R_{EHE,i}$, $M_i$, $t_i$ are the EHE coefficient, the magnetization normal to the layer plane and the thickness of the respective section i. Thus, a film containing two parallel sections with the respective values of $I_1$, $R_{EHE,1}$, $M_1$ and $t_1$ will exhibit four remanent EHE voltages corresponding to states $M_1 M_2$, $M_1(-M_2)$, $(-M_1)M_2$ and $(-M_1)(-M_2)$ given respectively by a set:

$$V_{EHE} = \frac{\mu_0}{2}\left(\frac{I_1 R_{EHE,1} M_1}{t_1} + \frac{I_2 R_{EHE,2} M_2}{t_2}\right) \quad [10a]$$

$$V_{EHE} = \frac{\mu_0}{2}\left(\frac{I_1 R_{EHE,1} M_1}{t_1} - \frac{I_2 R_{EHE,2} M_2}{t_2}\right) \quad [10b]$$

$$V_{EHE} = \frac{\mu_0}{2}\left(-\frac{I_1 R_{EHE,1} M_1}{t_1} + \frac{I_2 R_{EHE,2} M_2}{t_2}\right) \quad [10c]$$

$$V_{EHE} = -\frac{\mu_0}{2}\left(\frac{I_1 R_{EHE,1} M_1}{t_1} + \frac{I_2 R_{EHE,2} M_2}{t_2}\right) \quad [10d]$$

A film composed of three parallel layers will exhibit eight different Hall voltage signals corresponding to eight different combinations of remanent magnetizations in its three layers. In general, magnetic film containing n different layers can exhibit $2^n$ different EHE signals at zero field.

Figure 5A:
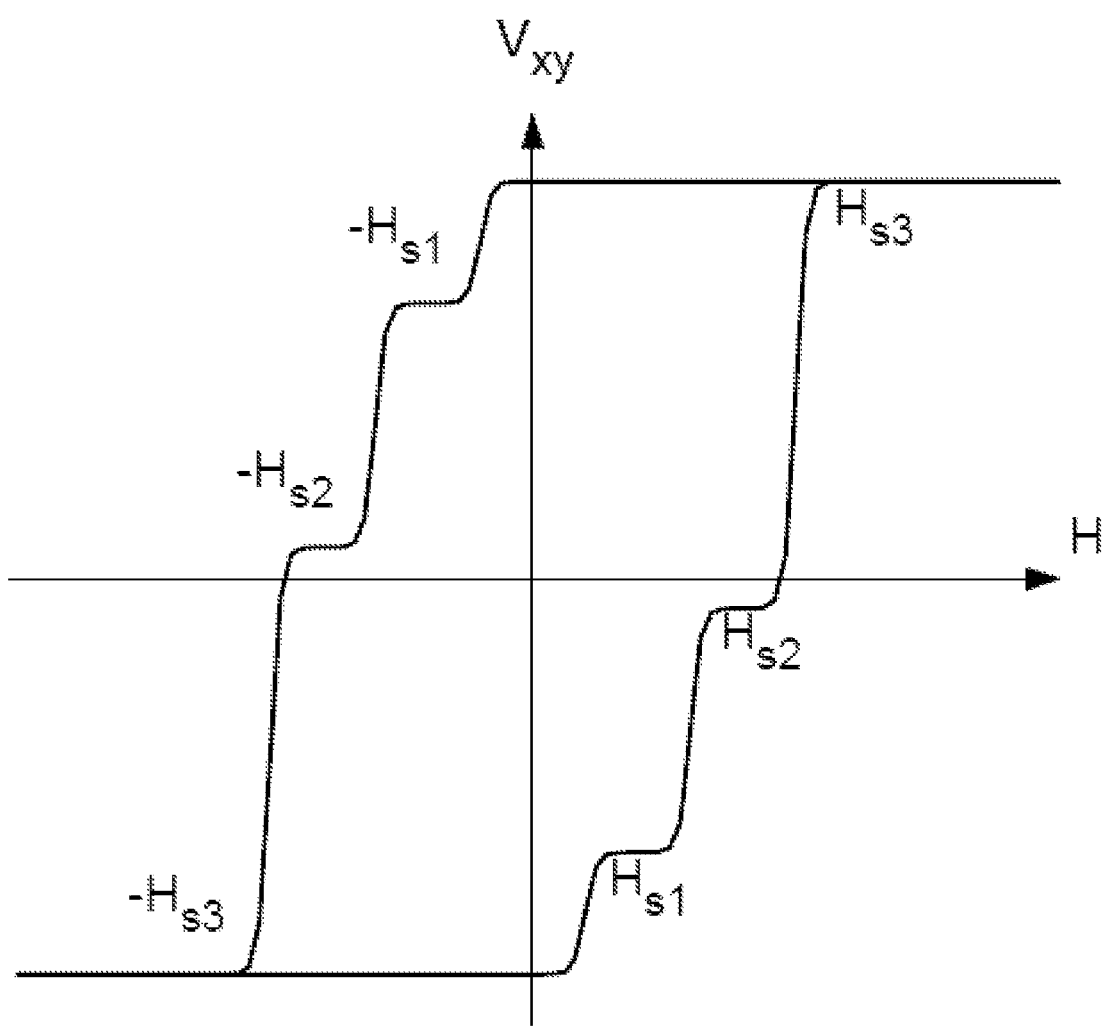
FIG. 5a is a schematic presentation of a major hysteresis loop of a magnetic film composed of three layers, each of them exhibiting a perpendicular magnetic anisotropy with different switching fields and extraordinary Hall resistances, according to an embodiment of the present invention.
Figure 5B:
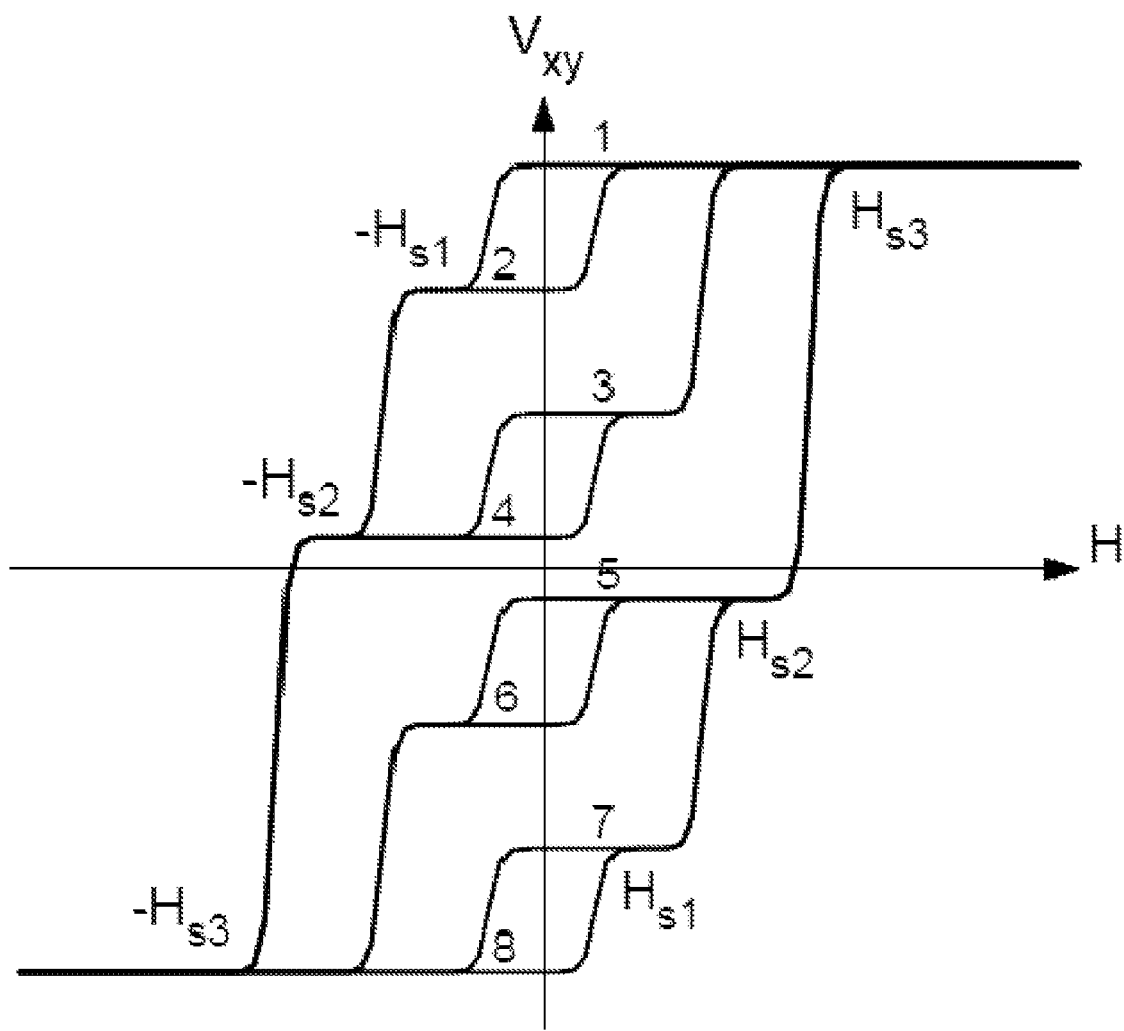
FIG. 5b is a schematic presentation of minor hysteresis loops exhibiting 8 distinct stable voltages at zero field, according to an embodiment of the present invention.

The writing procedure of different memory states in a single multilayer film is presented schematically in FIGS. 5a and 5b for an example of a film composed of three layers, each of them exhibiting a perpendicular magnetic anisotropy with different switching fields and extraordinary Hall resistances.

FIG. 5a presents a major hysteresis loop in which the EHE voltage is measured as a function of applied magnetic field swept between high positive field to high negative field and back to high positive field, according to an embodiment of the present invention. Magnetization reversal from −M state towards +M state proceeds in three distinct steps at three switching fields $H_{s1}$, $H_{s2}$ and $H_{s3}$ during the field sweep from negative field towards a high positive field, and magnetization reversal from +M state towards −M state proceeds in three distinct steps at switching fields $-H_{s1}$, $-H_{s2}$ and $-H_{s3}$ during the field sweep from positive field towards a high negative field. FIG. 5b presents a set of minor loops with a total of eight different remanent states at zero field, according to an embodiment of the present invention.

In an embodiment, a protocol of writing different memory states can be defined as follows. By way of example, the protocol described herein assumes starting by resetting the cell using a high value magnetic field pulse, Those having ordinary skill in the art will be able to adapt the description below, to write different memory states, to generate different protocols, including protocols with fewer pulses to achieve a given memory state.

Define the magnetic writing fields $H_{w1}$, $H_{w2}$, and $H_{w3}$, produced by a magnetic field generator, such that $H_{S2} > H_{w1} > H_{S1}$, $H_{S3} > H_{w2} > H_{S2}$, and $H_{w3} > H_{S3}$.

State 1 is achieved by applying field $H_{w3}$ and returning to zero.

State 2 is achieved by applying the following sequence of field pulses: $H_{w3}$, $-H_{W1}$ and returning to zero.

State 3 is achieved by applying the following sequence of field pulses: $H_{w3}$, $-H_{W2}$, $H_{w1}$ and returning to zero.

State 4 is achieved by applying the following sequence of field pulses: $H_{w3}$, $-H_{W2}$ and returning to zero.

State 5 is achieved by applying the following sequence of field pulses: $-H_{w3}$, $H_{W2}$ and returning to zero.

State 6 is achieved by applying the following sequence of field pulses: $-H_{w3}$, $H_{W2}$, $-H_{w1}$ and returning to zero.

State 7 is achieved by applying the following sequence of field pulses: $-H_{w3}$, $H_{W1}$ and returning to zero.

State 8 is achieved by applying field $-H_{w3}$ and returning to zero.

A memory cell disclosed herein contains two electrically connected films, wherein each of the films contains one or a plurality of parallel layers, each of the layers having a respective thickness, EHE coefficient and magnetization.

The voltage developed between two electrically connected magnetic films described above, is given by:

$$V_{AD,FC} = V_L + \frac{V_{AD,FB} + V_{AD,EC}}{2} \quad [11]$$

$$= V_L + \frac{\mu_0}{2} \sum_i \frac{I_i R_{EHE,i} M_i}{t_i}$$

where $V_L$ is the voltage from the longitudinal resistance contributed by a current carrying portion of film 1, a current carrying portion of film 2 and the electrical connection between film 1 and film 2. Index i includes all parallel sections of film 1 and film 2 together. For the first film containing $n_1$ layers and the second film containing $n_2$ layers the number of different combinations of magnetization and, therefore a number of different output voltage signals is $2^{n_1+n_2}$. Since each voltage signal corresponds to a respective memory state, the number of memory states per cell is $2^{n_1+n_2}$. A voltage difference among different memory states is:

$$\Delta V_{i,j} = V_{AD,FC}^i - V_{AD,FC}^j,$$

where $V_{AD,FC}^i$ and $V_{AD,FC}^j$ correspond to different magnetization states.

Figure 6A:
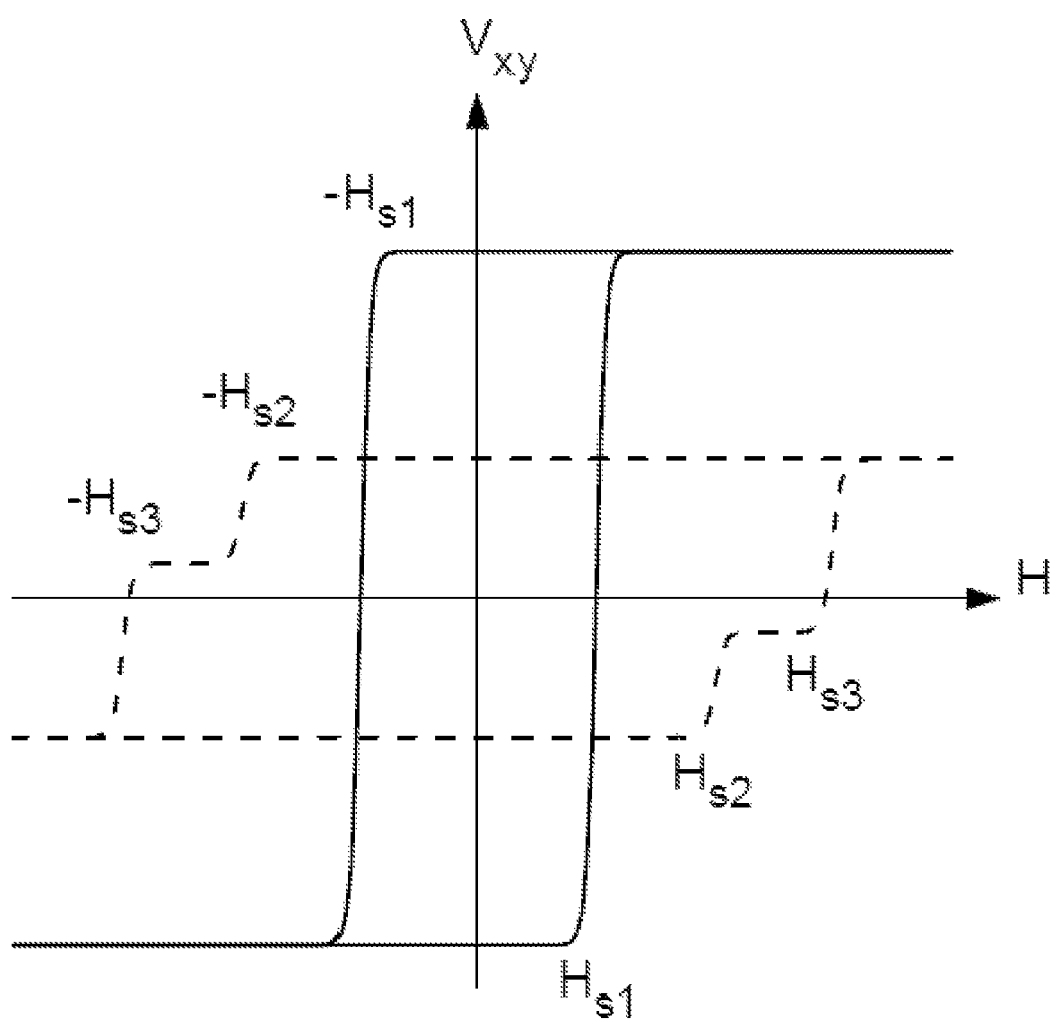
FIG. 6a shows a combination of two films: one with a single layer and single step magnetization reversal and the second with two layers and double-step reversal, according to an embodiment of the present invention.
Figure 6B:
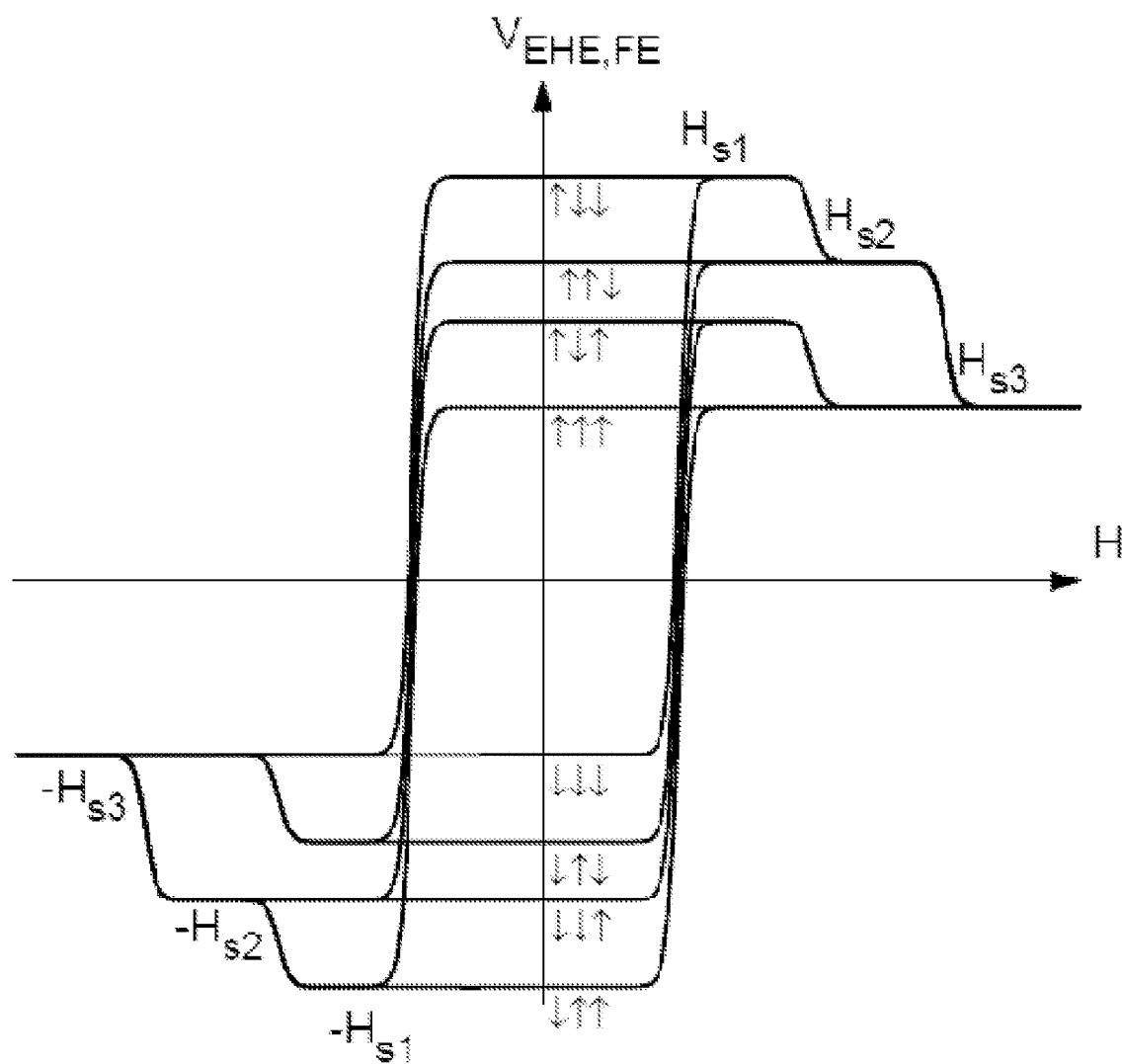
FIG. 6b is a schematic presentation of EHE voltage VEHE, FE measured between points F (film 1) and E (film 2) at different minor loops and at a major loop after removal of a longitudinal voltage V1, according to an embodiment of the present invention.

FIGS. 6a, 6b, and 6c are schematic presentations of EHE voltages developed in a cell containing a first film composed of a single layer and exhibiting a single step magnetization reversal and a second film composed of two layers and exhibiting a double-step magnetization reversal, according to an embodiment of the present invention.

FIG. 6a shows the EHE voltage developed at contacts BF of the first film exhibiting a single step reversal at switching fields $\pm H_{s1}$ and at contacts CE of film 2 exhibiting a double step reversal at fields $\pm H_{s2}$ and $\pm H_{s3}$.

FIG. 6b presents the EHE voltage $V_{EHE,FE}$ measured between points F (film 1) and E (film 2) after removal of longitudinal voltage $V_1$. $V_{EHE,FE}$ equals half the difference between the EHE signal across film 1 ($V_{AD,BF}$) and the EHE signal across film 2 ($V_{AD,CE}$) (see Eq. 3).

FIG. 6c presents the EHE voltage $V_{EHE,FC}$ measured between points F (film 1) and C (film 2) after removal of longitudinal voltage $V_1$. $V_{EHE,FC}$ equals half the sum of the EHE signal across film 1 ($V_{AD,BF}$) and the EHE signal across film 2 ($V_{AD,CE}$) (see Eq. 2).

The eight memory states available in this memory cell may be written in the following pulse sequences:

Define the writing fields $H_{w1}$, $H_{w2}$, and $H_{w3}$, such that $H_{S2} > H_{w1} > H_{S1}$, $H_{S3} > H_{w2} > H_{S2}$, and $H_{w3} > H_{S3}$.

State 1 is achieved by applying field $H_{w3}$ and returning to zero.

State 2 is achieved by applying field sequence $H_{w3}$, $-H_{W1}$ and returning to zero.

State 3 is achieved by applying field sequence $H_{w3}$, $-H_{W2}$, $H_{w1}$ and returning to zero.

State 4 is achieved by applying field sequence $H_{w3}$, $-H_{W2}$ and returning to zero.

State 5 is achieved by applying field sequence $-H_{w3}$, $H_{W2}$ and returning to zero.

State 6 is achieved by applying field sequence $-H_{w3}$, $H_{W2}$, $-H_{w1}$ and returning to zero.

State 7 is achieved by applying field sequence $-H_{w3}$, $H_{W1}$ and returning to zero.

State 8 is achieved by applying field $-H_{w3}$ and returning to zero.

In the examples described herein, the magnetic states are written by applying a sequence of pulses that alternate in polarity and decrease in magnitude along the sequence. This choice, however, is made purely by way of example. In alternative embodiments, the magnetic states can be written using any other suitable sequence of magnetic pulses, or in any other suitable way.

In an alternative embodiment of a memory cell the switching fields of films F1 and F2 may be ordered in different ways. For example, in a cell with film F1 exhibiting a double-step magnetization reversal at switching fields $H_{s1}$ and $H_{s2}$, and film F2 exhibiting a single-step magnetization reversal at field $H_{s3}$, $H_{s3}$ can be larger or smaller than $H_{s2}$ and larger or smaller than $H_{s1}$.

Figure 7:
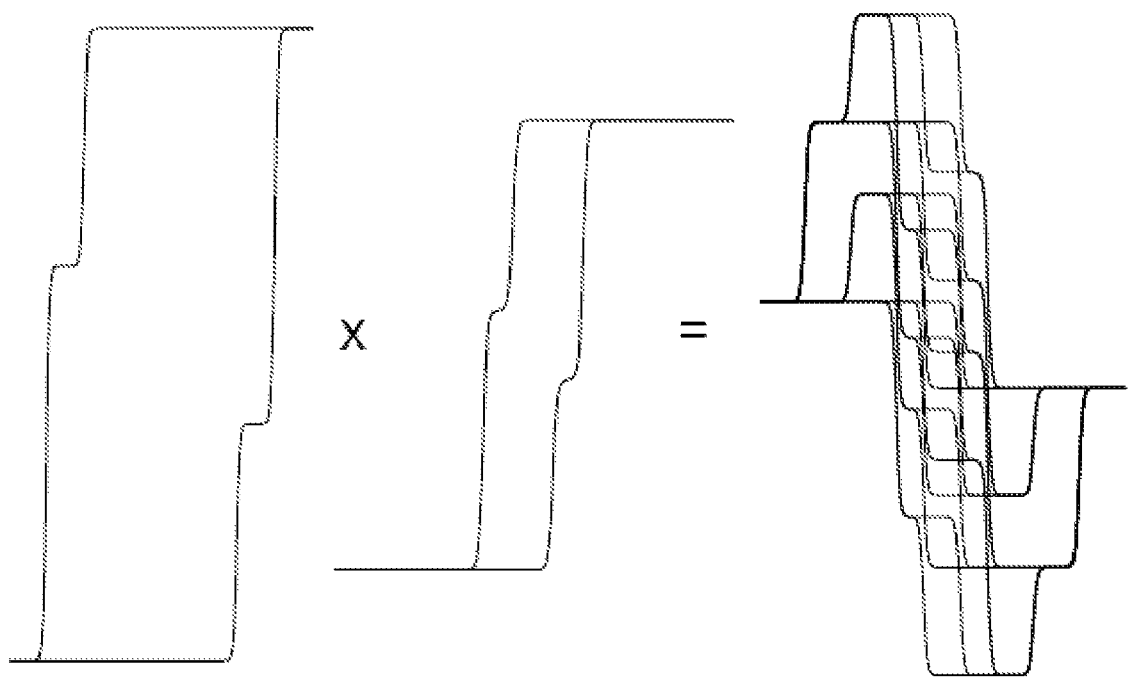
FIG. 7 is a schematic presentation of a combination of two double-layer, double-step reversal films exhibiting sixteen different voltage states at zero field after application of different sequences of magnetic field pulses, according to an embodiment of the present invention.

In a further alternative embodiment of a memory cell the first film is composed of two layers and exhibits a double-step magnetization reversal and the second film is composed of two layers and exhibits a double-step magnetization reversal, with all component layers of two films exhibiting different values of switching fields and EHE resistances. In this case the number of available magnetic memory states is 16, as illustrated in FIG. 7.

Figure 8:
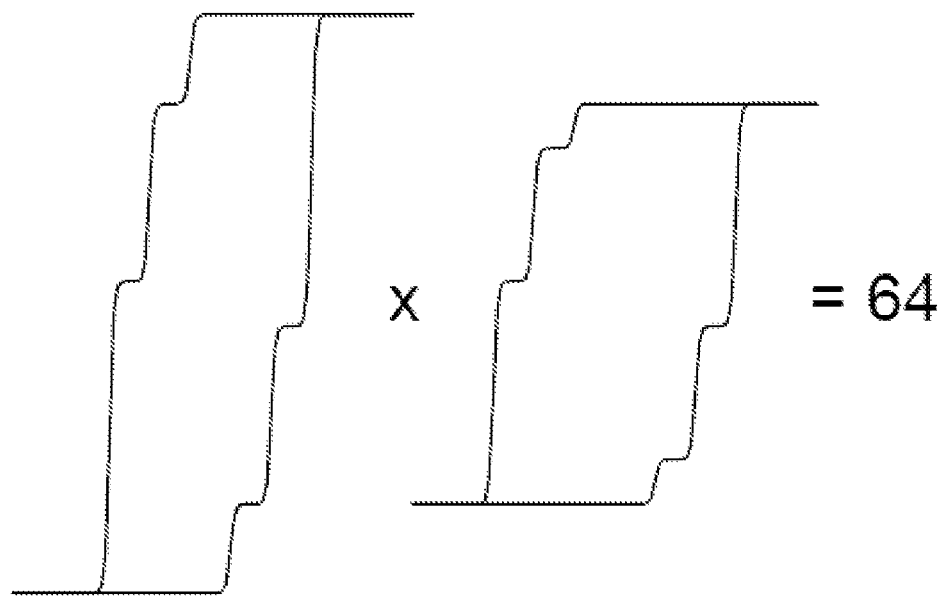
FIG. 8 is a schematic presentation of a combination of two triple-layer, triple-step reversal films exhibiting sixty four different voltage states at zero field after application of different sequences of magnetic field pulses, according to an embodiment of the present invention.

In a yet further alternative embodiment of a memory cell the first film is composed of three layers and exhibits a triple-step magnetization reversal and the second film is composed of three layers and exhibits a triple-step magnetization reversal, with all component layers of two films exhibiting different values of switching fields and EHE resistances. In this case the number of available magnetic memory states is 64, as illustrated in FIG. 8.

The ferromagnetic structure of all films of a memory cell may be made from a single layer of material exhibiting perpendicular magnetic anisotropy or multiple layers of materials exhibiting perpendicular magnetic anisotropy. Typically, in order to reduce an inter-layer coupling and conserve different magnetic properties in different layers, the layers are separated by non-magnetic spacer layer. Ferromagnetic layers may be made from a variety of materials known in the art, including, but not limited to, Co, Co/Pd multilayers, Co/Pt multilayers, Fe/Pt multilayers, Fe/Pd multilayers, CoPt, CoPd, FePt, FeTb alloys, diluted magnetic semiconductors, and half metals, all possessing perpendicular magnetic anisotropy. The spacer layer may be made from non-magnetic electrically conductive material, such as Pd, Pt, Cu, Ru, Ti or other material. Alternatively, the spacer layer may be made from electrically insulating material such as $SiO_2$, alumina ($Al_2O_3$), or MgO. Further alternatively, the spacer layer may be made from non-magnetic conductive material containing high concentration of insulating impurities, such as $PdSiO_2$, $CuSiO_2$, etc. Insulating impurities can be added to a metallic spacer in order to increase electrical resistance of the spacer layer and thus to reduce the fraction of electric current flowing along the spacer layer as compared with current flowing along ferromagnetic layers. Alternatively, films with multiple layers can be made with no spacer layer, such as thin Co/Pd multilayers grown on a thin Pd seed under-layer.

To achieve ferromagnetic layers with different switching fields and different EHE resistances different ferromagnetic materials, different seed layers, different thicknesses and different polarities of the extraordinary Hall effect (EHE coefficient $R_{EHE}$ can be positive or negative in different materials) may be utilized as known in the art.

Magnetic memory cells disclosed herein are visualized to be part of a network making a portion of, or an entire, magnetic random access memory device or other memory device. It will be understood that the physical location and relative positioning of films comprising a given cell is not restricted. For example, a magnetic memory cell containing two ferromagnetic films exhibiting different switching fields and different EHE resistances may be located in proximity to each other in the same plane of a magnetic memory device. In an alternative embodiment, two films composing a given cell may be located in different layers or planes of a magnetic memory device. Two different fabrication methods may be implemented for these two cases. For films located in the same plane of the device the selective fabrication of one type of films and the selective fabrication of the second type of films are performed at the same device layer. For the alternative embodiment, identical films of the first type may be fabricated in the first layer of the device, identical films of the second type may be fabricated at a different layer of the device, and electrical interconnections between the films may be fabricated vertically between the layers of the device.

It will be understood that films comprising a memory cell are spatially separated. Typically, the spatial separation may be adjusted to improve the temporal stability of a cell, so that, for example, a stronger layer does not adversely affect a weaker layer. In addition the spatial separation may be adjusted to facilitate the writing procedure, for example allowing high field pulses to be applied to stronger layers, and low field pulses to be applied to weaker layers. The writing procedure may be implemented using a field generating network, such as a grid of current-carrying wires, and the procedure may be optimized by adjusting both the film spatial separation and the arrangement of the network.

Figure 9:
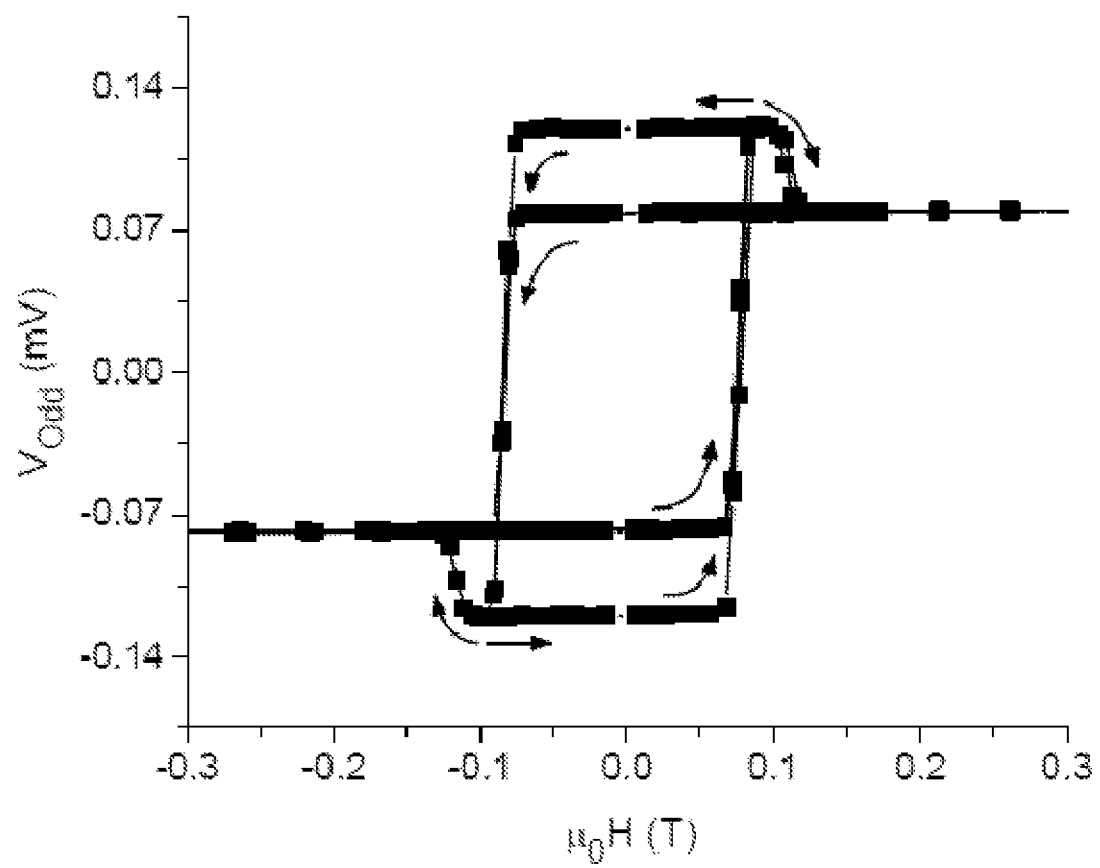
FIG. 9 shows an experimental realization of a memory cell composed of two single-layer single-step reversal films exhibiting four different EHE voltage states at zero field, according to an embodiment of the present invention.

To illustrate the feasibility of magnetic memories disclosed herein we present in FIG. 9 an experimental implementation of a four-states cell. FIG. 9 presents the EHE voltage measured between contacts F and E of two single layer films, according to an embodiment of the present invention. The first and second films were fabricated by e-beam deposition of Co/Pd multi-strata structures composed of 2 Å thick Co and 9 Å thick Pd strata repeated six times [Co 2 Å Pd 9 Å]$_6$, so that each single layer film is a multi-strata unit. The depositions were on 100 Å thick Pd and 50 Å thick Pd seed substrates respectively. In this example, each multi-strata structure corresponded to a single ferromagnetic layer, each of the structures having a given switching field and a given EHE resistance. As is illustrated in the graph each single layer (multi-strata structure) has a different EHE resistance, which is assumed to be due to the different thicknesses of Pd seed substrate.

Figure 10:
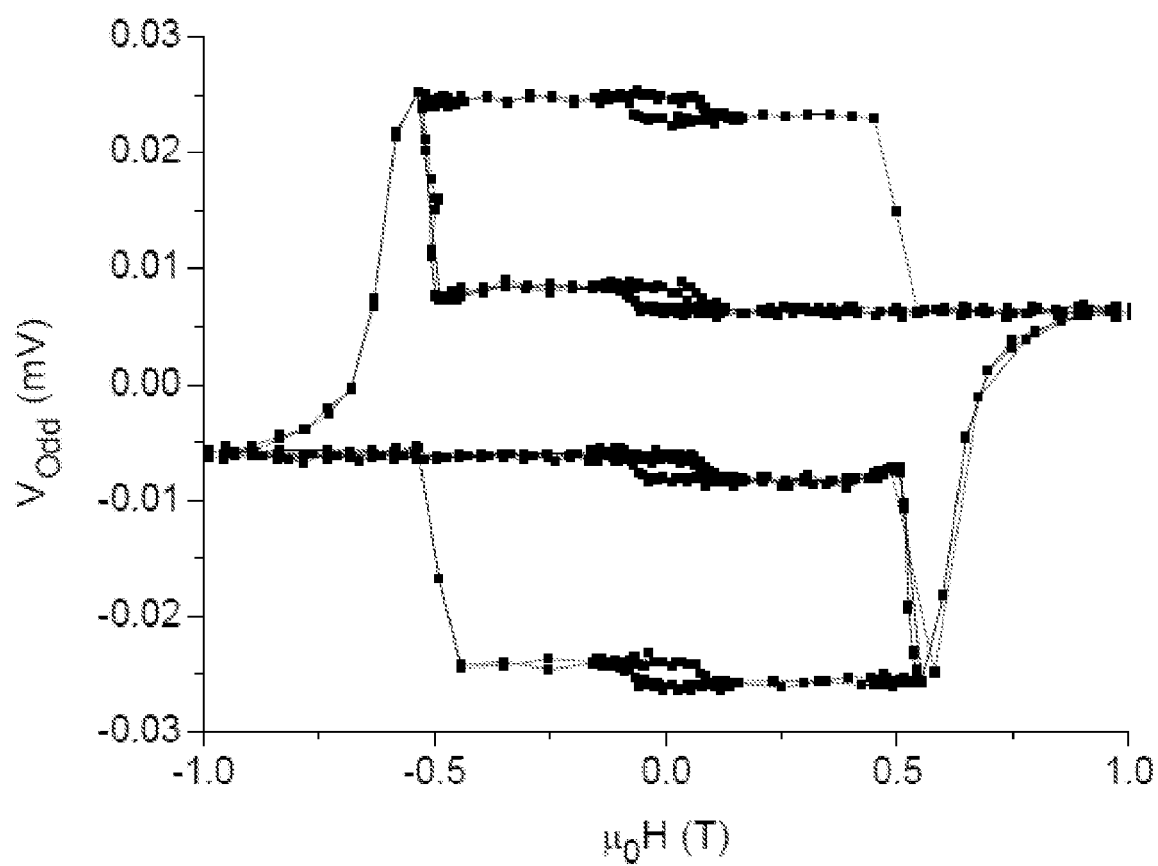
FIG. 10 shows an experimental realization of a memory cell composed of a single-layer single-step reversal film and a double-layer double-step reversal film exhibiting eight different EHE voltage states at zero field, according to an embodiment of the present invention.

FIG. 10 presents an experimental implementation of an eight-states memory cell, according to an embodiment of the present invention. The first film exhibiting a single step reversal was fabricated by e-beam deposition of a Co/Pd multi-strata structure composed of 2 Å thick Co and 9 Å thick Pd strata repeated six times [Co 2 Å Pd 9 Å]$_6$ deposited on a 100 Å thick Pd seed substrate on top of a glass substrate. The second film exhibiting a double step magnetization reversal was fabricated by e-beam deposition of a Co/Pd multi-strata structure composed of 2 Å thick Co and 9 Å thick Pd strata repeated six times [Co 2 Å Pd 9 Å]$_6$ deposited on a 75 Å thick Pd seed substrate on top of a GaAs substrate. The different properties of the multi-strata structures, i.e., the fact that the first film has single step reversal whereas the second film has double step reversal, are assumed to be due to the different substrates upon which the structures are deposited.

Figure 11:
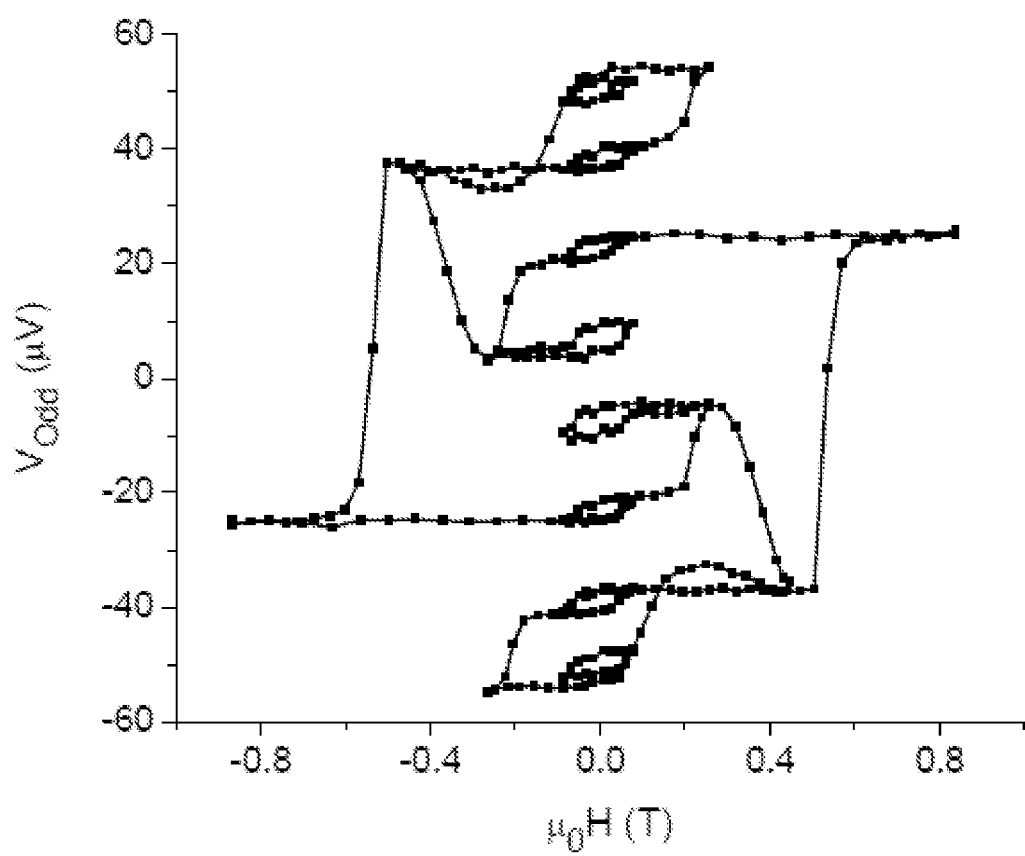
FIG. 11 shows an experimental realization of a memory cell composed of two double-layer double-step reversal films exhibiting sixteen different EHE voltage states at zero field, according to an embodiment of the present invention.

FIG. 11 presents an experimental implementation of a sixteen-states memory cell, according to an embodiment of the present invention. The first film of the cell exhibiting a double step magnetization reversal was fabricated by e-beam deposition of a Co/Pd multilayer structure composed of 2 Å thick Co and 9 Å thick Pd layers repeated six times [Co 2 Å Pd 9 Å]$_6$ deposited on a 75 Å thick Pd seed layer on top of a GaAs substrate. (This film has the same form as the second film of the example of FIG. 10.) The second film of the cell exhibiting a double step magnetization reversal was fabricated on a GaAs substrate by e-beam deposition of a Co/Pd multilayer structure, the first multilayer component comprising 2 Å thick Co and 9 Å thick Pd layers repeated six times [Co 2 Å Pd 9 Å]$_6$, followed by 30 Å thick Pd spacer, followed by the second multilayer component comprising 4 Å thick Co and 9 Å thick Pd layers repeated six times [Co 4 Å Pd 9 Å]$_6$.

Figure 12:
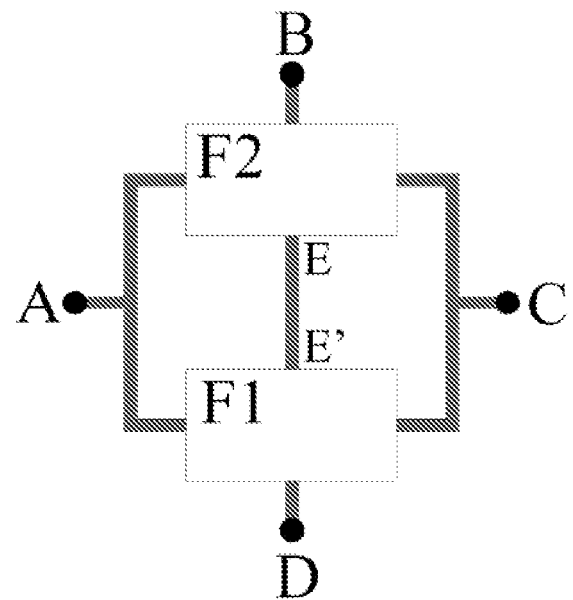
FIGS. 12 and 13 are schematic views of alternative memory cells, according to embodiments of the present invention.
Figure 13:
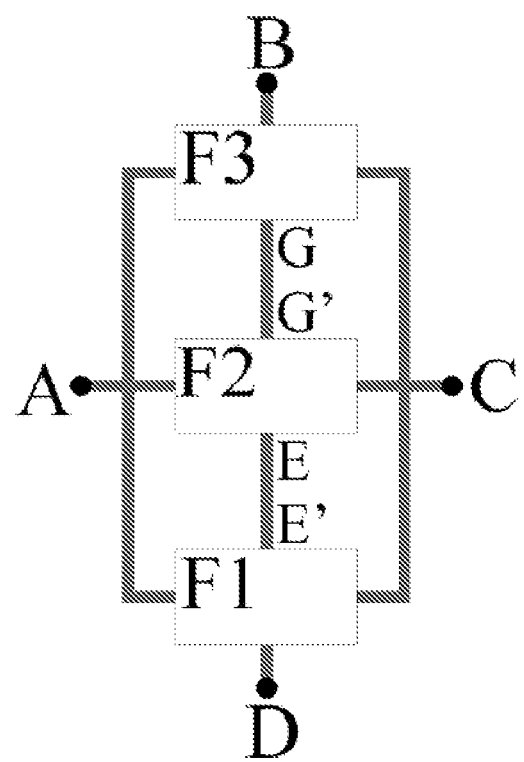

FIG. 12 and FIG. 13 are schematic views of alternative memory cells, according to embodiments of the present invention. In the memory cell illustrated in FIG. 1, the films constituting the cell are connected in series, so that the same bias current (between A and D) traverses film F1 and film F2. In contrast, in the alternative memory cell illustrated in FIG. 12, films F1 and F2 are connected in parallel. Similarly, in the alternative memory cell illustrated in FIG. 12, films F1, F2, and F3 are connected in parallel. In both alternative cells there is a bias current, between A and C, which is distributed between the films of the alternative cells. Typically the distribution is not equal, in which case the bias currents in each cell are different. Alternatively, the distribution may be equalized or otherwise modified, for example by adjusting the film resistance and/or by adding resistance.

In the case of the cell illustrated in FIG. 12, the number of memory states per cell is $2^{n_1+n_2}$, where film F1 has $n_1$ ferromagnetic layers and film F2 has $n_2$ layers, as described above with reference to equation (11). In the case of the cell illustrated in FIG. 13, the number of memory states per cell is $2^{n_1+n_2+n_3}$, where film F3 has $n_3$ layers. In the parallel memory cell configuration illustrated in FIG. 12, a conductor EE' may connect parts of films F1 and F2 where the extraordinary Hall voltage is developed, although in some embodiments having two films in parallel, there is no conductor EE'. In the parallel memory cell illustrated in FIG. 13, conductor EE' connects films F1 and F2, and a conductor GG' connects films F2 and F3. The conductors in the cell of FIG. 13 also connect parts of the films where the extraordinary Hall voltage is developed. Because of the presence of the conductors between the films, the memory state of the cell of FIG. 12 may be determined by direct measurement of the voltage between points B and D of the cell. For a similar reason, the memory state of the cell of FIG. 13 may also be determined by direct measurement of the voltage between points B and D of the cell, i.e. by measurement between the "lowest" part of film F1, and the "highest" part of film F3.

In general, for a memory cell having k films connected in parallel (k a positive integer), where the $p^{th}$ film (1≤p≤k) has $n_p$ ferromagnetic layers, the cell has $2^{n_1+\cdots+n_p+\cdots+n_k}$ memory states. Such a memory cell may have (k−1) conductors connecting the films. The different states of the general cell may be found by measuring the voltage between the "lowest" part of the first film, and the "highest" part of the $k^{th}$ film, i.e., the parts of the films that are not connected to conductors, and where the extraordinary Hall voltage is developed.

In the case of films connected in parallel, the RMFR system described above may be implemented, e.g., to reduce any mismatch that may occur in locations of the contacts measuring the Hall voltage. For example, in FIG. 12, contact B may not be exactly opposite contact E, and/or E' may not be exactly opposite contact D. The RMFR system may be used to allow for such mis-alignment.

The voltage offset reduction scheme as described above can also be implemented in other devices made of two normal Hall effect sensors in series or in parallel, which may not exhibit the extraordinary Hall effect. In a different embodiment corresponding to FIG. 1, films F1 and F2 may each be made of a low carrier density material film in the shape of a cross which constitutes a Hall sensor, on top of which a spacer is placed to prevent electric current leakage. On top of the spacer a ferromagnet, or ferromagnets, may be deposited, as disclosed in U.S. Patent Application Publication 2008/0205129 to J. Stephenson, B. Shipley, and D. Carothers, whose disclosure is incorporated herein by reference. Such ferromagnets have a set of stable magnetic orientations, and may be placed at locations that induce a strong magnetic stray flux through the sensor. The normal Hall resistance in the low carrier density film is sensitive to cumulative stray flux from the magnetized ferromagnets, and gives rise to a set of different Hall voltages. By connecting the films as illustrated in FIG. 1, and measuring $V_{AD,FE}-V_{FE,AD}$, or $V_{AD,FC}-V_{FC,AD}$ with, for example, a processor, the Hall voltage is separated from the offset voltage by use of the reverse magnetic field reciprocity.

Generally, when multiple memory cells (e.g., of the type shown in FIG. 12 or FIG. 13) are arranged in a memory array, each memory cell has a single external address, typically corresponding to the cell's row and column, and thus has four external terminals. Storage layers within the memory cell are interconnected. The sensing circuit typically does not measure the Extraordinary Hall voltages of the various layers separately, but rather a combination of them, wherein each combination generates a different signal.

The disclosed techniques provide a possibility of fabricating 3-D memory with a freedom in positioning the elements of the same cell at different levels and locations. This design flexibility is important, for example, in mitigating inter-dot coupling and programming of a given memory element without affecting the others.

FIG. 14 is a block diagram that schematically illustrates a memory device 20, according to an embodiment of the present invention. In the present example, memory device 20 comprises one or more memory cells 22 that are based on the disclosed techniques, such as the memory cells shown in FIG. 1, 12 or 13. A current source 24 generates electrical currents (also referred to herein as bias currents) that flow in memory cells 22. A magnetic field generator 26 generates magnetic fields, for example in order to store data in memory cells 22 according to the protocols explained above. A sensing circuit 28 senses the Hall voltages of the memory cells for retrieving the data stored in the memory cells.

The configuration of memory device 20 shown in FIG. 14 is an example configuration, which is chosen purely for the sake of conceptual clarity. In alternative embodiments, any other suitable memory device configuration can be used.

It will be understood that memory cells according to embodiments of the present invention may be constructed in a substantially planar or two dimensional format, where each film of a cell lies on a common plane, Alternatively, memory cells according to embodiments of the present invention may be constructed in a substantially three dimensional format, for example having films of the cell on different planes, or even stacked substantially vertically on each other.

In a three-dimensional multi-layer structure (as well as in other configurations), the magnetic field for writing the magnetic states can be generated separately in different layers by multiple field generation networks.

In the embodiments described herein, the magnetic states are written (programmed) by applying magnetic pulses. The disclosed memory cell configurations and readout techniques, however, are in no way limited to this kind of programming. For example, in alternative embodiments, the magnetic states can be written by applying current pulses through the memory cell in order to reverse the magnetization polarity, e.g., using spin torque transfer. The disclosed memory cell configurations and readout techniques can be used with such current-based programming, or with any other suitable programming scheme.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A device for storing data in a data cell formed of a plurality of ferromagnetic films, comprising:
    a plurality of ferromagnetic films, including first and second films, having perpendicular magnetic anisotropy, which can develop extraordinary Hall resistance, each film having terminals arranged such that when a bias current is passed through a first pair of the terminals of the film, a voltage between a second pair of the terminals depends on the extraordinary Hall resistence developed in the film;
    one or more electrical conductors connecting a first terminal the first film to a first terminal of the second film, to form a bias current path between a second terminal of the first film and a second terminal of the second film, through the plurality of films and the one or more electrical conductors;
    a current source for connecting to the second terminals of the first and second films, and configured to inject currents through the bias current path, so as to generate extraordinary Hall voltages in the plurality of ferromagnetic films; and
    a sensing circuit, which is configured to measure a voltage between a terminal of the first film and a terminal of the second film, and to determine from the measured voltage a data value stored in the data cell formed of the plurality of films.

2. The device according to claim 1, wherein at least one of the ferromagnetic films comprises a plurality of ferromagnetic layers separated by a non-magnetic spacer layer.

3. The device according to claim 1, wherein one or more electrical conductors connect the ferromagnetic films in series to one another, such that a same read bias current passes from the current source, through the one or more electrical conductors and each of the ferromagnetic films, wherein the current source is configured to apply the electrical current so as to traverse the ferromagnetic films and the conductors.

4. The device according to claim 1, wherein the one or more electrical conductors connect the ferromagnetic films in parallel to one another, wherein the current source is configured to generate and apply a first electrical current to a first ferromagnetic film and a second electrical current, different from the first electrical current, to the second ferromagnetic film, and wherein the sensing circuit is configured to measure a sum of extraordinary Hall voltages of the ferromagnetic films.

5. The device according to claim 1, wherein the sensing circuit is configured to apply a reverse magnetic field reciprocity (RMFR) theorem to the films so as to measure the voltage.

6. The device according to claim 1, and comprising a magnetic field generator, which is configured to store the data in the ferromagnetic films by applying a magnetic field that writes into the ferromagnetic films respective magnetic states that represent the data.

7. The device according to claim 6, wherein the magnetic field generator is configured to accept the data for storage, to produce, responsively to the data, a sequence of one or more magnetic field pulses that write the magnetic states, and to apply the sequence to the ferromagnetic films.

8. The device according to claim 7, wherein the magnetic field generator is configured to produce the sequence responsively to the data and to respective switching magnetic fields of the ferromagnetic films.

9. The device according to claim 7, wherein the magnetic field generator is configured to produce the magnetic field pulses so as to alternate in polarity and decrease in magnitude along the sequence.

10. The device according to claim 1, wherein the first and second ferromagnetic films lie in a common two-dimensional plane.

11. The device according to claim 1, wherein the ferromagnetic films are stacked on top of one another to form a three-dimensional structure.

12. The device according to claim 1, wherein the ferromagnetic films include first and second ferromagnetic films characterized by respective, different switching magnetic fields.

13. A method for data storage in a data cell formed of a plurality of ferromagnetic films, comprising:
providing a plurality of ferromagnetic films, including first and second films, having terminals, which are connected to one another through one or more electrical conductors, and which films have perpendicular magnetic anisotropy;
storing data in the first and second ferromagnetic films by configuring the perpendicular magnetic anisotropy of the films responsively to the data;
injecting electrical current through a current bias circuit which passes through each of the films between a pair of terminals of the film, and over conductors in passage between terminals of different films; and
reading out the stored data by measuring a voltage between a terminal of the first film not serving as a terminal of the second film and a terminal of the second film not serving as a terminal of the first film.

14. The method according to claim 13, wherein at least one of the ferromagnetic films comprises a plurality of ferromagnetic layers.

15. The method according to claim 14, wherein each ferromagnetic layer defines one of two memory states.

16. The method according to claim 15, wherein the first film comprises n1 layers, the second film comprises n2 layers, wherein n1, n2 are integers greater than 0, and wherein the number of memory states is $2^{n1+n2}$.

17. The method according to claim 13, wherein the ferromagnetic films are connected in series to one another by a conductor, and wherein injecting the electrical current comprises applying the electrical current so as to traverse the ferromagnetic films and the one or more conductors in series.

18. The method according to claim 13, wherein the ferromagnetic films are connected in parallel to one another by the one or more conductors, and wherein injecting the electrical current comprises applying a first electrical current to a first ferromagnetic film and a second electrical current, different from the first electrical current, to a second ferromagnetic film, and wherein measuring the extraordinary Hall voltages comprises measuring a sum of extraordinary Hall voltages of the ferromagnetic films.

19. The method according to claim 13, wherein measuring the voltage comprises applying a reverse magnetic field reciprocity (RMFR) theorem to the films so as to measure the voltage.

20. The method according to claim 13, wherein storing the data comprises applying a magnetic field that writes into the ferromagnetic films respective magnetic states that represent the data.

21. The method according to claim 20, wherein applying the magnetic field comprises accepting the data for storage, producing, responsively to the data, a sequence of one or more magnetic field pulses that write the magnetic states, and applying the sequence to the ferromagnetic films.

22. The method according to claim 21, wherein producing the sequence comprises generating the sequence responsively to the data and to respective switching magnetic fields of the ferromagnetic films.

23. The method according to claim 21, wherein producing the sequence comprises generating the magnetic field pulses so as to alternate in polarity and decrease in magnitude along the sequence.

24. The device according to claim 1, wherein the ferromagnetic films are partially spatially separated.

25. The device according to claim 1, wherein the plurality of ferromagnetic films have non-overlapping areas.

26. The device according to claim 1, wherein the current source is configured to inject current to a plurality of different paths through the films and wherein the sensing circuit is configured to measure a plurality of different voltages between a plurality of different pairs of terminals of two respective ones of the films, and to determine the data value stored in the plurality of films from the plurality of measured voltages.

27. The device according to claim 1, wherein current passes between the first and second ferromagnetic films only through the first terminal of the first film and the first terminal of the second film.

* * * * *